(12) United States Patent
Ghosal et al.

(10) Patent No.: US 10,259,980 B2
(45) Date of Patent: Apr. 16, 2019

(54) SINTERING POWDER

(71) Applicant: Alpha Assembly Solutions Inc., Somerset, NJ (US)

(72) Inventors: Shamik Ghosal, Bangalore (IN); Ranjit Pandher, South Plainfield, NJ (US); Oscar Khaselev, Monmounth Junction, NJ (US); Ravi Bhatkal, South Plainfield, NJ (US); Rahul Raut, South Plainfield, NJ (US); Bawa Singh, Voorhees, NJ (US); Morgana Ribas, Bangalore (IN); Siuli Sarkar, Bangalore (IN); Sutapa Mukherjee, Bangalore (IN); Sathish Kumar, Bangalore (IN); Remya Chandran, Bangalore (IN); Pavan Vishwanath, Bangalore (IN); Ashok Pachamuthu, Bangalore (IN); Monnir Boureghda, Bangalore (IN); Nitin Desai, Bangalore (IN); Anna Lifton, Bangalore (IN); Nirmalya Kumar Chaki, Bangalore (IN)

(73) Assignee: Alpha Assembly Solutions Inc., Somerset, NJ (US)

( * ) Notice: Subject to any disclaimer, the term of this patent is extended or adjusted under 35 U.S.C. 154(b) by 284 days.

(21) Appl. No.: 14/438,888

(22) PCT Filed: Oct. 29, 2013

(86) PCT No.: PCT/GB2013/052817
§ 371 (c)(1),
(2) Date: Apr. 28, 2015

(87) PCT Pub. No.: WO2014/068299
PCT Pub. Date: May 8, 2014

(65) Prior Publication Data
US 2015/0353804 A1    Dec. 10, 2015

Related U.S. Application Data

(60) Provisional application No. 61/781,338, filed on Mar. 14, 2013, provisional application No. 61/772,343, (Continued)

(51) Int. Cl.
*B22F 1/00*        (2006.01)
*B22F 1/02*        (2006.01)
(Continued)

(52) U.S. Cl.
CPC .............. *C09K 5/14* (2013.01); *B22F 1/0011* (2013.01); *B22F 1/0014* (2013.01); (Continued)

(58) Field of Classification Search
CPC . C09K 5/14; B22F 1/02; B22F 1/0011; B22F 1/0014; B22F 1/0062; B22F 1/0074; (Continued)

(56) References Cited

U.S. PATENT DOCUMENTS 4,463,030 A    7/1984 Deffeyes et al.
7,081,214 B2 *  7/2006 Matsuba ............... B22F 1/0062
                                                        252/500

(Continued)

OTHER PUBLICATIONS

International Search Report, PCT/GB2013/052817, dated Feb. 4, 2014, 4 pages.

*Primary Examiner* — Anthony J Zimmer
(74) *Attorney, Agent, or Firm* — Carmody Torrance Sandak & Hennessey LLP

(57) ABSTRACT

A sintering powder comprising: a particulate having a mean longest diameter of less than 10 microns, wherein at least some of the particles forming the particulate comprise a
(Continued)

metal at least partially coated with a capping agent. A sintering paste and sintering film comprising the sintering powder. A method for making a sintered joint by sintering the sintering powder, paste, or film in the vicinity of two or more workpieces.

8 Claims, 13 Drawing Sheets

Related U.S. Application Data filed on Mar. 4, 2013, provisional application No. 61/719,700, filed on Oct. 29, 2012.

(51) Int. Cl.
| | | |
|---|---|---|
| *C01G 5/00* | (2006.01) | |
| *C09C 1/62* | (2006.01) | |
| *C09C 3/08* | (2006.01) | |
| *C09K 5/14* | (2006.01) | |
| *B82Y 30/00* | (2011.01) | |

(52) U.S. Cl.
CPC .............. *B22F 1/0062* (2013.01); *B22F 1/02* (2013.01); *B82Y 30/00* (2013.01); *C01G 5/00* (2013.01); *C09C 1/62* (2013.01); *C09C 3/08* (2013.01); *B22F 1/0018* (2013.01); *B22F 1/0074* (2013.01); *B22F 2001/0066* (2013.01); *C01P 2002/72* (2013.01); *C01P 2002/88* (2013.01); *C01P 2004/04* (2013.01); *C01P 2004/53* (2013.01); *C01P 2004/61* (2013.01); *C01P 2004/64* (2013.01); *C01P 2006/22* (2013.01); *C01P 2006/32* (2013.01); *C01P 2006/40* (2013.01); *H01L 2924/0002* (2013.01)

(58) Field of Classification Search
CPC .......... B22F 2001/0066; B22F 1/0018; B82Y 30/00; C09C 3/08; C09C 1/62; C01G 5/00; H01L 2924/0002; C01P 2004/61; C01P 2006/40; C01P 2004/04; C01P 2002/88; C01P 2002/72; C01P 2006/32; C01P 2006/22; C01P 2004/64; C01P 2004/53

See application file for complete search history.

(56) References Cited

U.S. PATENT DOCUMENTS

| | | |
|---|---|---|
| 2004/0004209 A1 | 1/2004 | Matsuba et al. |
| 2008/0032047 A1* | 2/2008 | Parashar ............... B22F 1/0018 427/372.2 |
| 2009/0025967 A1 | 1/2009 | Boureghda et al. |
| 2010/0025639 A1 | 2/2010 | Ogi et al. |
| 2010/0283013 A1 | 11/2010 | Sato et al. |
| 2012/0043510 A1 | 2/2012 | Kurihara et al. |

* cited by examiner

SINTERING POWDER

REFERENCE TO RELATED APPLICATIONS

This application is a U.S. national stage application of International Patent Application No. PCT/GB2013/052817, filed Oct. 29, 2013, and claims the benefits of priority of U.S. Application No. 61/719,700, filed Oct. 29, 2012, U.S. Application No. 61/772,343, filed Mar. 4, 2013, and U.S. Application No. 61/781,338, filed Mar. 14, 2013, the entire disclosures of which are incorporated herein by reference.

FIELD OF THE INVENTION

The invention relates to a sintering powder, a sintering paste and film comprising the sintering powder, and a sintered joint formed using the same.

BACKGROUND OF THE INVENTION

Sintered joints provide an alternative to soldered joints. A typical method of forming a sintered joint involves placing a metal powder, often in the form of a powder compact, between two work pieces to be joined and then sintering the metal powder. The resulting atomic diffusion of the metal atoms forms a bond between the two work pieces.

Metal nanopowders have been used to form sintered joints in the electronics industry, and are considered to be useful alternatives to lead-free soldering. The differing behaviour between nanomaterials and the corresponding bulk material is thought to be due to nanomaterials having a higher surface-to-volume ratio.

Sintering powders containing silver nanoparticles are known. Sintered joints formed by atomic diffusion of silver nanoparticles can be processed at a temperature significantly lower than the melting temperature of the bulk and can also be used for high temperature applications. The potential advantages, such as high temperature stability, high electrical and thermal conductivity, and good mechanical properties, make such sintering powders promising candidates for die attachment applications. However, the sintering temperatures of such sintering powders are still too high for effective use in most electronics applications.

Sintering temperatures may be reduced by applying an external pressure during sintering. Pressure-assisted low-temperature sintering of silver paste has been shown to be a viable alternative to solder reflow as a die-attachment method. The application of high pressure has been shown to significantly lower the sintering temperature, and the desired properties for die attachment can be achieved at a relatively faster rate resulting in the formation of a sintered joint within a few minutes. However, a large external pressure makes automation of the process difficult. Furthermore, application of a large external pressure may result in damage to the work pieces.

It is known to dispense solder paste for a variety of applications, but mostly as an alternative when wave solder or screen printing is not possible. Solder paste can be dispensed on a variety of surface mount applications on printed circuit boards, integrated circuit packages, and electrical component connectors. Typical problems of solder paste include: dripping, skipped dots, and inconsistent dispensing. Soft and hard solders are typically used in the electronic industries for die attached and dispensing. The soft solders are susceptible to fatigue failure under thermal cycling conditions. On the other hand, hard solders and glass matrix composites are used to enable devices to run at higher junction temperatures, but their higher elastic moduli and processing temperatures can generate high mechanical stresses in devices, and these materials also have relatively low thermal and electrical conductivities.

SUMMARY OF THE INVENTION

The present invention seeks to tackle at least some of the problems associated with the prior art or at least to provide a commercially acceptable alternative solution thereto.

The present invention provides a sintering powder comprising:

a particulate having a mean longest diameter of less than 10 microns, wherein at least some of the particles forming the particulate comprise a metal at least partially coated with a capping agent.

DETAILED DESCRIPTION OF PREFERRED EMBODIMENTS

Figure 1:
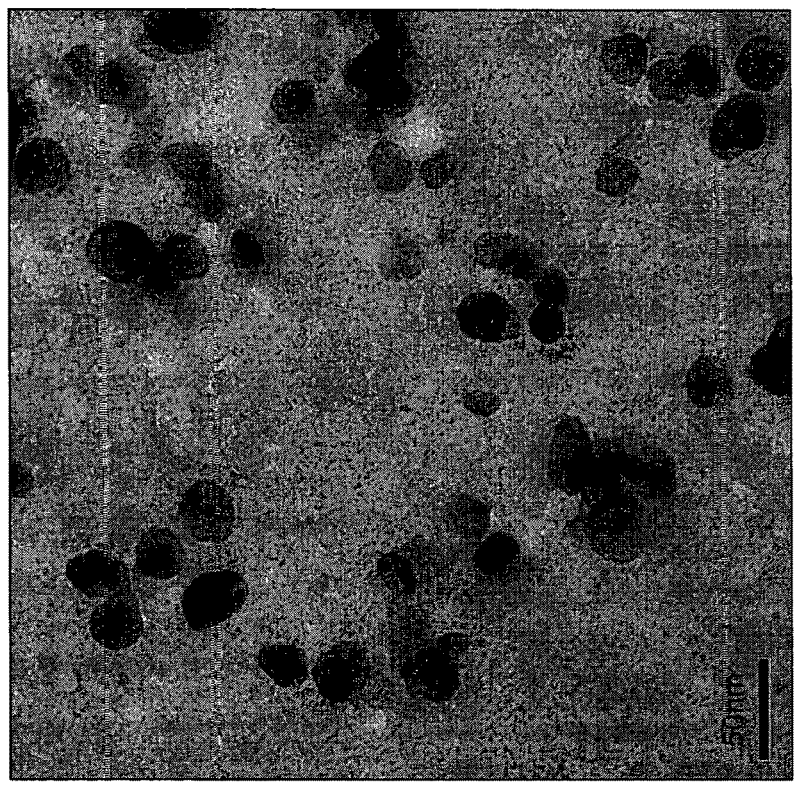
FIG. 1 shows TEM micrographs of a sintering powder of the present invention.
Figure 1:
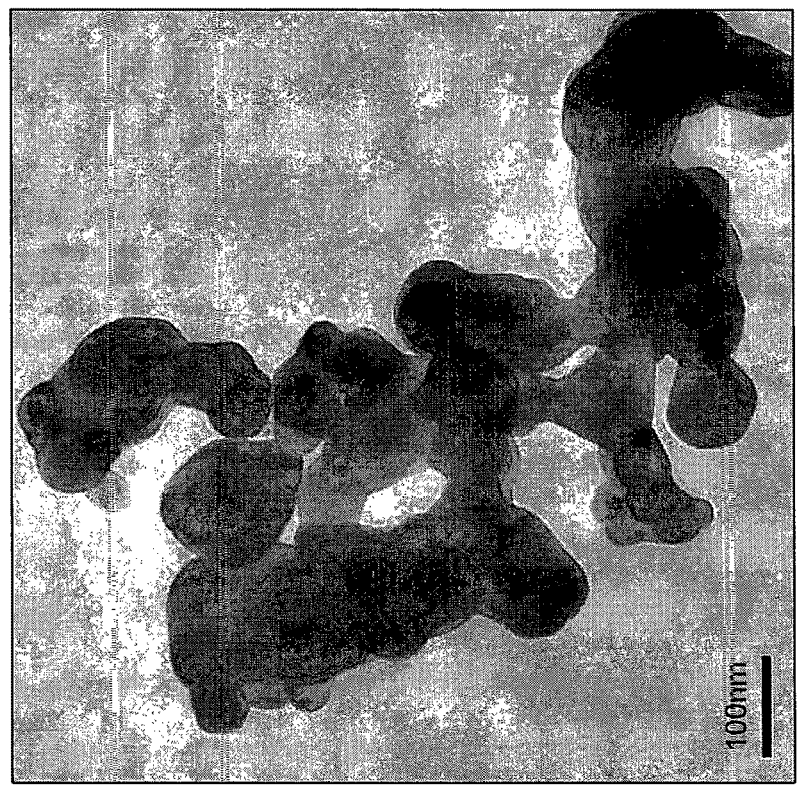

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

The term "sintering powder" as used herein may encompass a powder capable of forming a sintered joint. Sintered joints are formed by atomic diffusion of metal particles placed between two work pieces to be joined. The term "sintering powder" may encompass a particulate. The sintering powder may comprise regular shaped particles (such as, for example, spheres) or irregular shaped particles (such as, for example, whiskers, plates, rods or flakes).

The term "capping agent" as used herein may encompass a species that, when present on the surface of metal particles, reduces agglomeration of the metal particles, enables particle size control during powder production and reduces particles' surface oxidation or other contamination.

The inventors have surprisingly found that the sintering powder as described herein may be sintered at low temperatures with the application of only very low pressure, typically substantially no pressure. As a result, formation of a sintered joint between work pieces using the sintering powder may occur with reduced damage to the work pieces. In addition, since the application of high pressures is not required, the formation of a sintered joint is simplified, and may be more easily automated.

Advantageously, the use of a capping agent may help to reduce agglomeration of the particles making up the particulate. Such agglomeration is unfavourable, since it may increase the sintering temperature of the sintering powder. Accordingly, the use of a capping agent enables the formation of a sintered joint between work pieces at lower temperatures and, therefore, may help to reduce damage to a work piece caused by exposure to high sintering temperatures. In addition, the use of a capping agent may help to avoid degradation of the metal such as, for example, damage caused by exposure of the metal to air.

The particulate has a mean longest diameter of less than 10 microns. Typically most of the particles forming the particulate have a longest diameter less than 10 microns, more typically substantially all of the particles forming the particulate have a longest diameter of less than 10 microns. When the particles forming the particulate are spherical, the longest diameter will be the diameter of the sphere. When the particles forming the particulate are irregularly shaped, the longest diameter will be the longest dimension of the particle.

Since the particulate has a mean longest diameter of less than 10 microns, the particles forming the particulate exhibit a high surface-to-volume ratio. Such a high surface-to-volume ratio is particularly desirable since it may serve to decrease the sintering temperature of the sintering powder. The mean longest diameters referred to herein may be calculated using X-ray diffraction using Scherrer's formula.

In the sintering powder described herein at least some of the particles forming the particulate comprise a metal at least partially coated with a capping agent. Typically, the majority of particles forming the particulate comprise a metal at least partially coated with a capping agent, more typically substantially all of the particles forming the particulate comprise a metal at least partially coated with a capping agent. Typically the metal is substantially coated with a capping agent, more typically completely coated with a capping agent. Increasing the coverage of the capping agent on the metal particles may help to further reduce the agglomeration of the metal particles and, therefore, further reduce the sintering temperature.

At least some of the particles forming the particulate comprise a metal. The particles may all comprise the same metal. Alternatively, some of the particles may comprise different metals. In addition, individual particles may comprise two or more different metals. The term "metal" as used herein may encompass alloys. Accordingly, the particles may comprise one or more alloys of one or more metals.

During the sintering process, heating melts or chemically decomposes the capping agent and breaks molecular bonds between the metal atoms and the capping agent. Metal particles then begin to sinter.

The capping agent may be inorganic and/or organic. Examples of organic capping agents include polymers and ligands. Preferably the capping agent comprises an amine and/or a carboxylate functional group. Such capping agents may form a weak bond with the metal particles. Accordingly the temperature required to break the bonding may be reduced, which may help to reduce the sintering temperature. Capping agents that comprise an amine functional group are particularly preferred in this regard.

Preferably the capping agent comprises straight chain alkylamine (C6 to C18) or a branched chain aliphatic alkylamine. One preferred example is octylamine. Octylamine forms a particularly weak bond with metal particles. In addition, octylamine is particularly effective at reducing agglomeration of metal particles.

Preferably the particulate has a mean longest diameter of from 1 to 100 nm, more preferably from 5 to 75 nm, even more preferably from 5 to 65 nm. Such mean longest diameters may be particularly effective at providing a high surface-to-volume ratio. Particulates having a mean longest diameter smaller than 1 nm may be difficult to handle and may also be more susceptible to degradation.

The particulate may have a mean longest diameter of from 100 nm to 10 microns, preferably from 600 nm to 1 micron. Larger particle sizes may require less capping agent, typically substantially no capping agent. Accordingly, due to the reduction in residual organics in the resulting joint, the resistivity is much lower. In one aspect of the present invention, the particulate has a mean longest diameter of from 100 nm to 10 microns, preferably from 600 nm to 1 micron, and does not contain capping agent.

When the particulate has a mean longest diameter in the ranges specified above, typically most of the particles forming the particulate have a longest diameter within the range, more typically substantially all of the particles forming the particulate have a longest diameter within the range.

The particulate typically exhibits heterogeneous particles sizes. For example, the difference between the mean longest diameter of the largest 10% of the particles and mean longest diameter of the smallest 10% of the particles may be greater than 20 nm, typically greater than 30 nm, even more typically greater than 60 nm, still even more typically from 60 to 150 nm. The heterogeneous particle sizes may help to reduce the sintering temperature of the sintering powder, presumably due to the large point of contact between the particles. In addition, such heterogeneous sizes may help to increase the packing fraction.

The metal preferably comprises silver or an alloy thereof. Silver has excellent electrical and thermal conductivity, and is therefore capable of forming a sintered joint with high electrical and/or thermal conductivity. Accordingly, the use of silver metal makes the sintering powder particularly suitable for use in electronics applications, such as die attachment and microelectronic packaging. Alternatively, the metal may comprise other metals such as, for example, copper and gold.

The sintering powder preferably comprises up to 5 wt % capping agent, more preferably from 0.1 to 3 wt % capping agent, even more preferably about 1 wt % capping agent. If the sintering powder comprises more than 5 wt % capping agent, then higher temperatures may be required to melt the capping agent prior to sintering. If the sintering powder comprises less than 0.1 wt % capping agent, then the capping agent may not adequately cover the surface of the metal. This may result in an increase in agglomeration of the particles and, therefore, an increase in the sintering temperature.

The particulate preferably comprises a first type of particles having a longest diameter of from 1 to 100 nm and a second type of particles having a longest diameter of from greater than 100 nm to 50 microns. The presence of the second type of particles, having larger diameters, increases the contact points of the particles forming the particulate. This may result in better sintering and also an improved morphology of the powder. Accordingly, the thermocycling properties of a joint formed using such a powder are improved. In addition, the larger second type of particles typically do not require a capping agent. Accordingly, the total amount of capping agent in the sintering powder may be reduced, thereby minimising the existence of residual organics in any formed joint. As a result, the thermoconductivity and high temperature properties, such as thermocycling, are improved.

The first type of particles preferably have a diameter of from 5 to 75 nm and/or the second type of particles have a diameter of from greater than 100 nm to 20 microns, more preferably from 600 nm to 1 micron.

The particulate preferably comprises from 81 to 99 wt % of the first type of particles and from 1 to 19 wt % of the second type of particles, more preferably from 85 to 95 wt % of the first type of particles and 5 to 15 wt % of the second type of particles. Such ranges are particularly suitable for providing the combination of improved thermoconductivity and thermocycling properties, and low sintering temperature. In a preferred embodiment, the particulate comprises about 90 wt % of the first type of particles and about 10 wt % of the second type of particles.

In a particularly preferred embodiment, the sintering powder comprises:

a particulate having a mean longest diameter of from 1 to 100 nm, wherein at least some of the particles forming the particulate comprise silver at least partially coated with a straight chain or branched chain aliphatic amine, preferably octylamine.

In a further aspect, the present invention provides a sintered joint formed using the sintering powder as described herein. Such a sintered joint may exhibit particularly high strength and/or particularly high electrical and thermal conductivity. Furthermore, the sintered joint may exhibit very little change in shear strength following thermal shock, typically substantially no change in shear strength.

In a further aspect the present invention provides a sintering paste comprising:
the sintering powder as described herein;
a binder;
a solvent; and
optionally a rheology modifier and/or an activator and/or a surfactant.

The paste may be printable and/or dispensable and/or jettable and/or pin transferable. The paste may have viscosity and flow characteristics particularly favourable for dispensing, meaning that the paste may be used as a one-to-one replacement for solders.

The binder and/or solvent are typically selected so that they are able to be removed from the paste (for example by evaporation and/or burn out) at a temperature below the targeted sintering temperature of the sintering powder. This may help to promote near complete sintering of the metal particles. When organic material remains in the joint during sintering, inadequate sintering of the metal particles may occur. This may result in a weak sintered joint.

The binder may serve to bind the paste together so that it is easier to handle and position accurately in the location of a desired sintered joint. Examples of suitable binders include, but are not restricted to, hydroxypropylmethylcellulose, triacetin and polyvinyl acetate. Preferably the binder comprises an epoxy-based resin. Epoxy-based resin may be particularly effective at binding the paste together so that the paste is easier to handle and may be easier to position accurately in the location of a desired sintered joint. Furthermore, the use of epoxy resin may result in the formation of a stronger joint prior to sintering, meaning that there is no requirement to hold together the work pieces to be joined prior to sintering. The use of epoxy resin is particularly advantageous when the capping agent comprises an amine functional group. In this case, the amine acts as a hardener forming a cross-linked structure. This may result in a particularly strong joint prior to sintering.

The solvent preferably comprises a monoterpene alcohol and/or a glycol and/or glycol ether, preferably terpineol and/or triethylene glycol. Monoterpene alcohol and/or a glycol may be particularly effective at dispersing the metal particles within the paste, resulting in a homogeneous distribution of metal particles in the matrix of organic components with reduced cluster aggregation and/or agglomeration. The use of monoterpene alcohol and/or a glycol may serve to increase the flow-ability and printer-ability of the sintering paste.

A rheology modifier may be added to control the viscosity of the paste. Examples of suitable rheology modifiers include, but are not restricted to, Thixcin R and Crayvallac Super.

An activator may be added to remove any metal oxide that may be present from the surface being printed and/or to remove any oxides that may be present in the sintering powder. Aryl or alkyl carboxylic acids may be used as activators, such as, for example, one or more of adipic acid, succinic acid and glutaric acid.

A surfactant may be added to the sintering paste to help disperse the sintering powder in the sintering paste. Examples of suitable surfactants include, but are not restricted to, Disperbyk 163 and TritonX 100.

The sintering paste preferably comprises:
from 1 to 15 wt % binder; and/or
from 1 to 15 wt % solvent; and/or
up to 1 wt % rheology modifier; and/or
up to 1 wt % activator; and/or
up to 6 wt % surfactant.

Binder and/or solvent contents within these ranges may help to provide the sintering paste with particularly desirable flow-ability and printer-ability. Preferably the sintering paste comprises from 5 to 8 wt %, binder. In one embodiment the sintering paste comprises about 6.5 wt % binder. Preferably the sintering paste comprises from 5 to 8 wt %, solvent. In one embodiment the sintering paste comprises about 6.5 wt % solvent. The sintering paste may comprise at least 0.1 wt % rheology modifier and/or at least 0.1 wt % activator and/or at least 0.1 wt % surfactant.

In a further aspect the present invention provides a sintering paste comprising:
the sintering powder as disclosed herein;
an organosilver compound;
a solvent; and
optionally an activator and/or rheology modifier and/or surfactant.

During sintering, the organosilver compound may break down to metallic silver, which may increase the thermal conductivity of the sintered joint. In addition, the presence of the organosilver compound increases the wetting of the paste to the joint interface. The organosilver compound may comprise one or more of silver oxalate, silver lactate, silver citrate, silver peroxide, silver neodecanoate, silver succinate and silver stearate. In some embodiments, the organosilver compound may be omitted.

The sintering paste preferably further comprises one or more fatty acids, such as, for example, stearic acid, neodecanoic acid and lauric acid. The presence of fatty acids helps to bind the paste together. In other words, the presence of a fatty acid avoids the need for a separate binder, such as the epoxy based resin binder discussed above. Accordingly, the total amount of organics in the paste is less, resulting in a stronger final joint.

The sintering paste preferably further comprises a peroxide. Examples of suitable peroxides include, but are not restricted to, hydrogen peroxide, tertiary-butyl hydroperoxide and tertiary-butyl peroxy-2-ethylhexanoate. Peroxide introduces oxygen into the paste, which may aid sintering of the paste beneath the die area in a die attach method. The oxygen may also enable sintering of the metal particles under an inert atmosphere, such as, for example, a nitrogen atmosphere. The sintering paste preferably comprises up to 3 wt. % hydrogen peroxide, preferably from 0.5 to 2 wt. % hydrogen peroxide, more preferably from 0.7 to 1.8 wt. % hydrogen peroxide. Liquid peroxides are preferred to control rheology and silver settling.

The sintering paste may comprise a film forming agent such as, for example, a polyamide.

Preferably the sintering paste is substantially resin free, more preferably completely resin free. The presence of resin may reduce the thermal and electrical conductance of the silver. The solvent may comprise propylene carbonate.

The sintering paste preferably comprises:
from 1 to 15 wt % solvent; and/or
up to 50 wt % organosilver compound, preferably from 1 to 25 wt %, more preferably from 2 to 10 wt %, even more preferably from 3 to 9 wt %; and/or
up to 1 wt % rheology modifier; and/or
up to 1 wt % activator; and/or
up to 6 wt % surfactant.

The sintering paste may comprise at least 0.1 wt % rheology modifier and/or at least 0.1 wt % activator and/or at least 0.1 wt % surfactant.

In a further aspect the present invention provides a sintering film comprising the sintering powder as described herein and a binder. The film may be applied at the wafer level, die level, package/substrate level, and/or module level. Such a film may be obtained, for example, by printing the sintering paste as described herein onto a polyester sheet, heating the paste to at least partially remove the solvent and form a film, and then removing the film from the polyester sheet. The film as described herein is especially advantageous since it can be transferred on the die by simply pressing the die on to the film at slightly elevated temperature. Transferred film is an alternate application method, beneficially offered in certain situations.

In a further aspect the present invention provides the use of the sintering powder as described herein or the sintering paste or film as described herein in a method selected from: die attachment (e.g. chip-to-board, chip-to-substrate, chip-to-heat sink, chip-to-fixture), wafer-to-wafer bonding (e.g. chip-to-heat sink), reflective layer printing, hermetic and near hermetic sealing (for example for packages and perimeter seals), the production of interconnect lines (for example circuitry, pads), via filling in semiconductor devices and substrates, and flip-chip and wafer bumping.

In a further aspect the present invention provides a method of manufacturing a sintered joint comprising the steps:

providing the sintering powder as described herein or the sintering paste or film as described herein in the vicinity of two or more work pieces to be joined; and heating the sintering powder or sintering paste or film to at least partially sinter the metal.

Advantageously, the heating step may be carried out at atmospheric pressure. The sintering powder or sintering paste or film may be placed in the vicinity of the workpiece under low pressure (typically 1-5 MPa for 0.1 to 60 seconds at a temperature of about 175 to 250° C.).

The heating step is preferably carried out at a temperature of at least 140° C., more preferably from 150 to 350° C., even more preferably from 160 to 300° C. Temperatures lower than 140° C. may not result in adequate sintering of the particles in the sintering powder and/or may not result in adequate removal of the organics by evaporation and/or burn out. Temperatures higher than 350° C. may result in damage to the work pieces.

In a further aspect the present invention provides a method of manufacturing the sintering powder as described herein comprising the steps:
providing a metal salt solution;
contacting the metal salt solution with a capping agent; and
precipitating metal particles at least partially coated with the capping agent.

The precipitated metal particles may be recovered from the solvent, for example by filtering. An example of the metal salt solution is a metal nitrate solution.

The precipitating step may be carried out using a reducing agent. Reducing agents are particularly effective at causing precipitation of the metal particles. Particularly suitable reducing agents include, for example, hydrazine (e.g. hydrazine hydrate) and sodium borohydride.

Excess of the capping agent may be washed off using a polar solvent such as, for example, methanol or acetone.

The invention will now be described in relation to the following non-limiting examples.

Example 1—Preparation of Sintering Powder

The sintering powder was prepared in a single phase reaction. A 3 M ethylene glycol solution of silver nitrate was prepared by adding silver nitrate to ethylene glycol and stirring at 0 to 5° C. until the solution became clear. The solution was then made to 0.3 M by adding a mixture of 50% toluene and 50% ethanol. The silver nitrate solution (0.3 M, 3.5 liter) was then added to a toluene solution of octylamine (3.5 kg, 27.07 moles), which was prepared by adding octylamine to toluene at room temperature. 262.5 g (0.998 M, 5.24 moles) of 80% hydrazine hydrate dissolved in N,N dimethyl formamide was then immediately added. The reaction mixture was stirred for 45 minutes at a speed of 350 rpm before being allowed to settle for few a minutes. The colorless supernatant solution was then pumped out and the silver nanoparticles, which had settled at the bottom of the tank, were transferred to a Buchner funnel and washed with methanol to remove excess octylamine. Finally, the powder was washed with acetone and dried under vacuum at room temperature. The yield of the reaction was around 98%.

Figure 2:
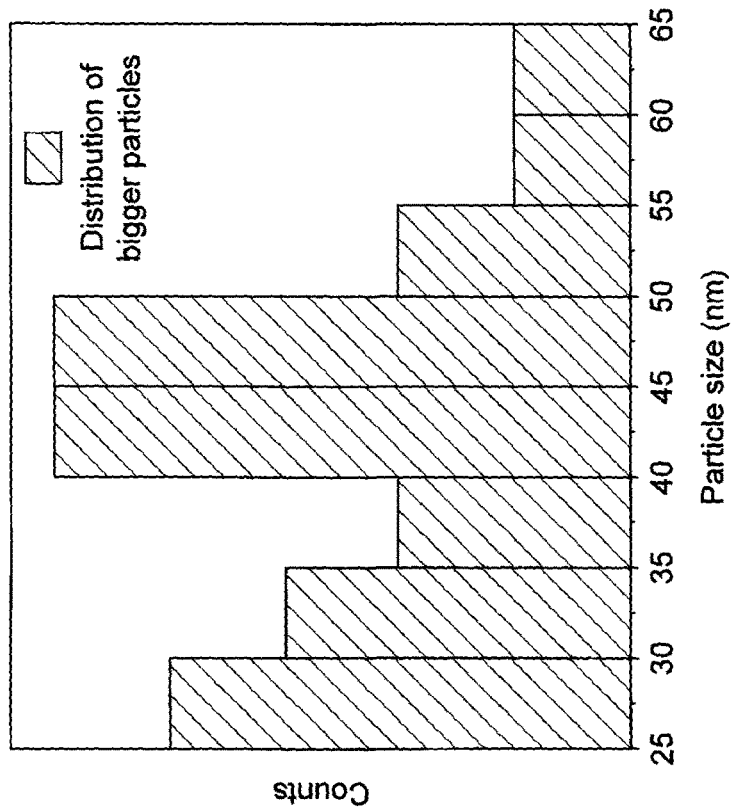
FIG. 2 shows histograms of the particles sizes of a sintering powder of the present invention.
Figure 2:
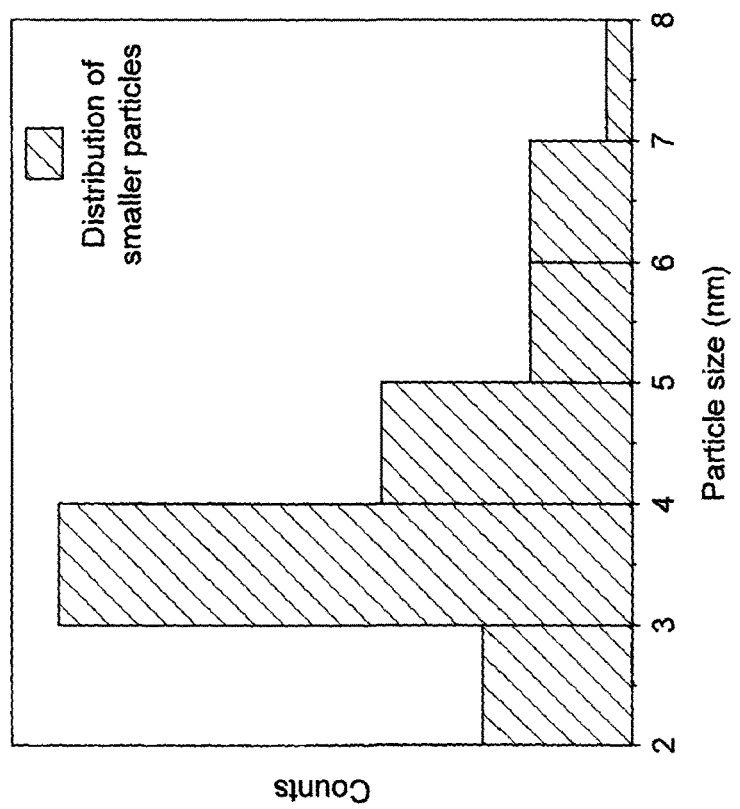

TEM micrographs of the powder were obtained and are shown in FIG. 1. The micrographs indicate silver nanoparticles heterogeneous in size ranging from 5 to 60 nm. Furthermore, the micrographs appear to indicate the distribution of very small particles around the larger grains. The distribution of the particles sizes is shown in FIG. 2 and appears to be bimodal.

Figure 3:
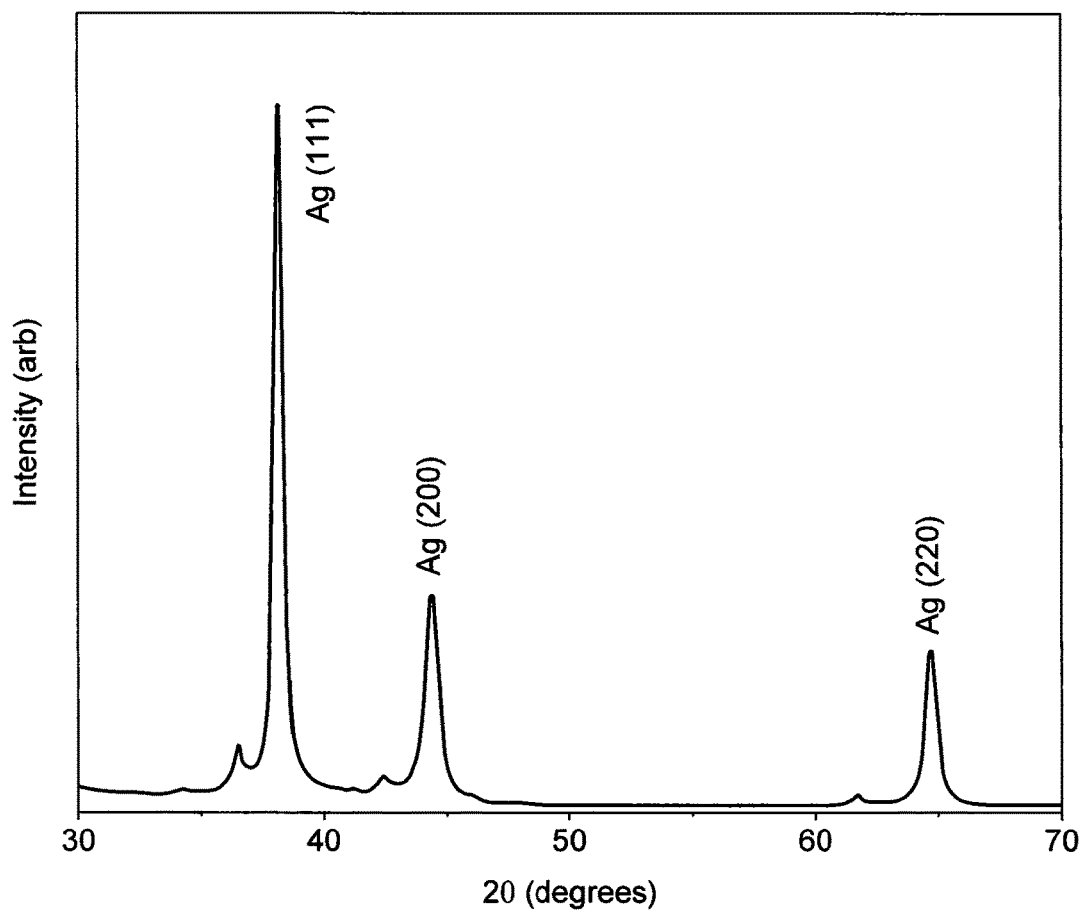
FIG. 3 shows a powder X-ray diffraction pattern of a sintering powder of the present invention.

FIG. 3 shows the powder X-ray diffraction pattern of the powder and indicates a face-centred cubic structure. Using the Scherrer formula, the mean particle size was calculated to be around 25 nm. This particle size was confirmed by the use of a particle size analyser (Microtrac Nanotrac Ultra NPA 253) which indicated a D50 of around 20 nm.

Figure 4:
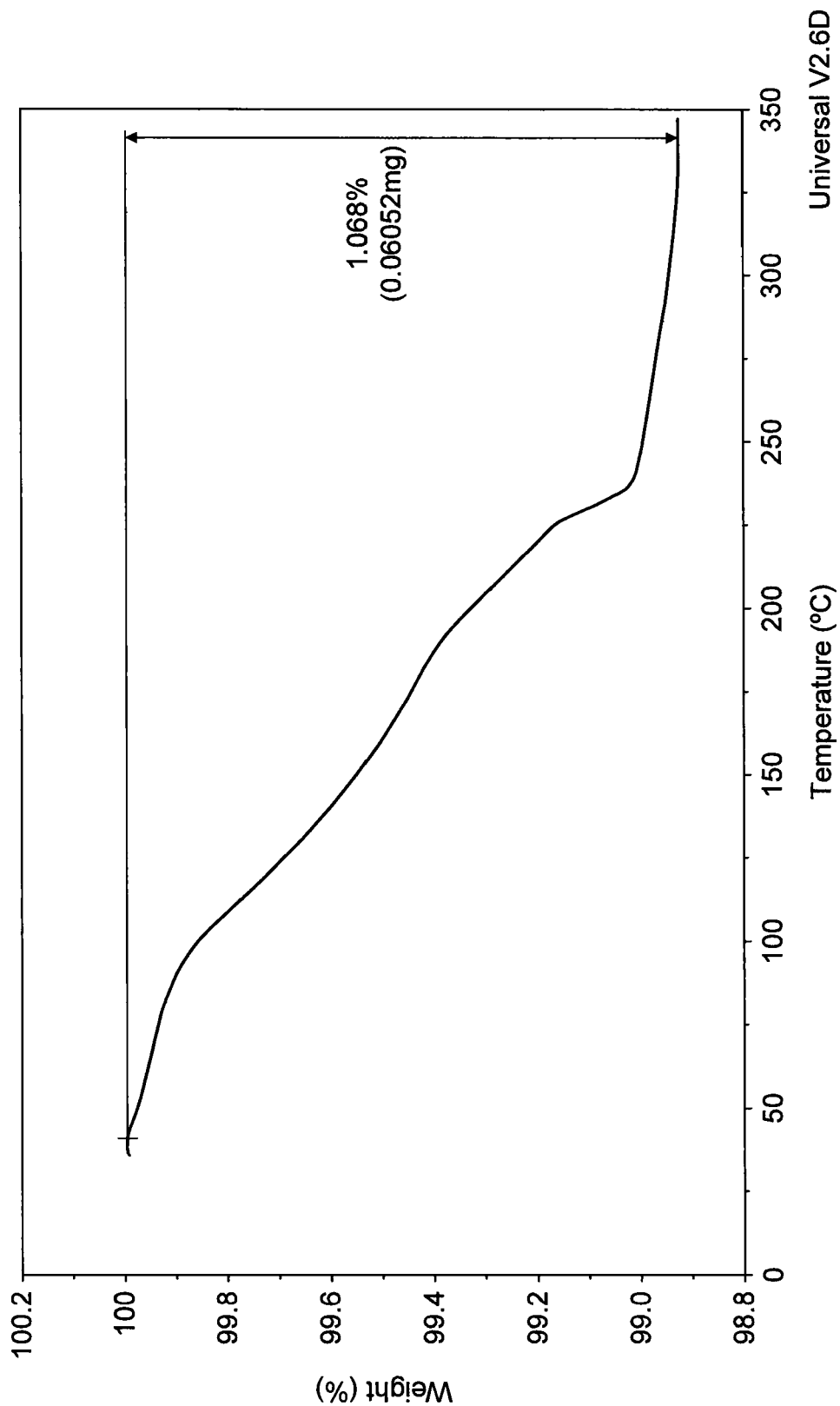
FIG. 4 shows a thermogram of a sintering powder of the present invention.

The powder was subjected to thermogravimetric analysis (TGA) and the corresponding thermogram is shown in FIG. 4. The results indicate that the powder comprises approximately 1 wt % capping agent, i.e. octylamine.

Figure 5:
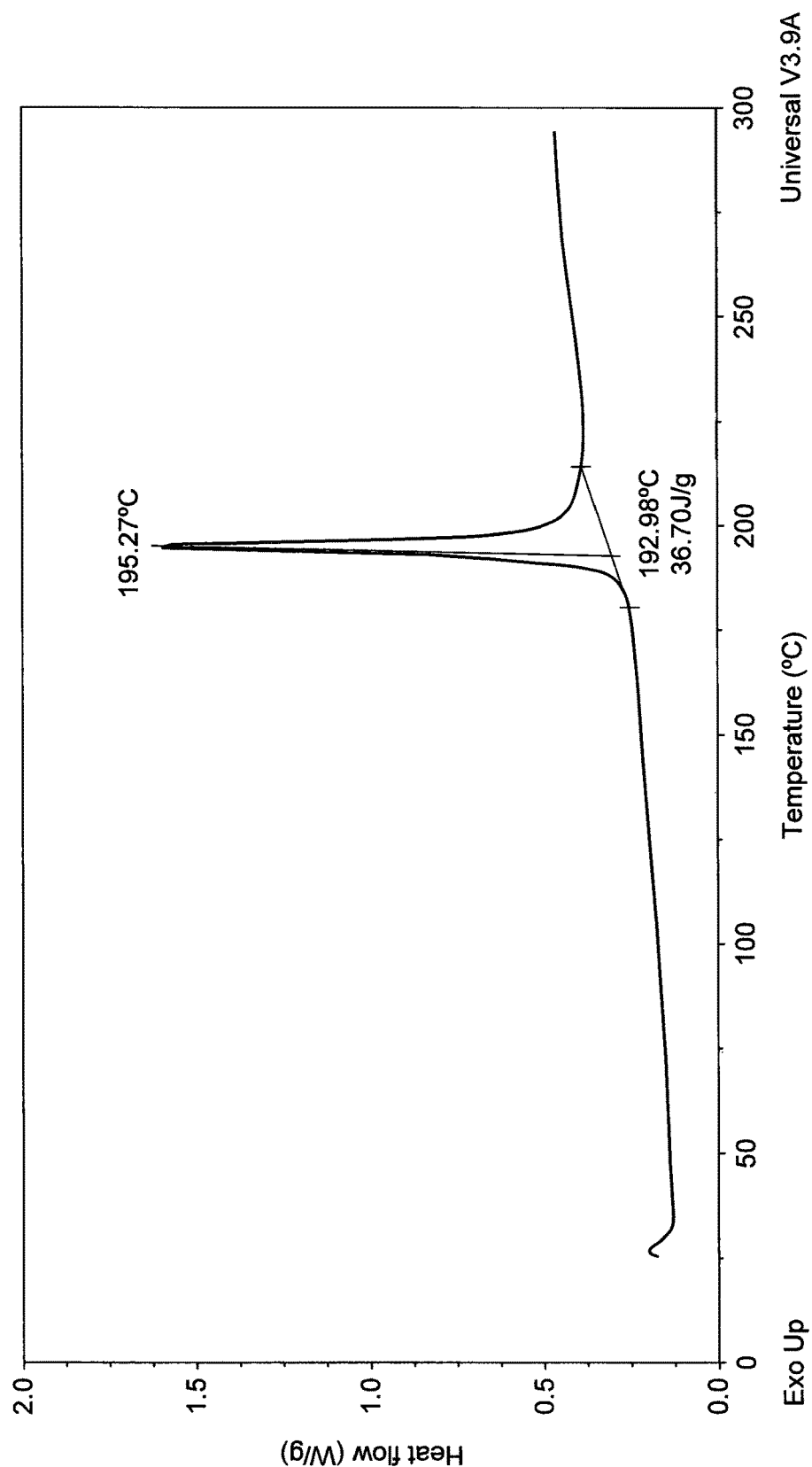
FIG. 5 shows the results of differential scanning calorimetry (DSC) analysis of a sintering powder of the present invention.
Figure 6:
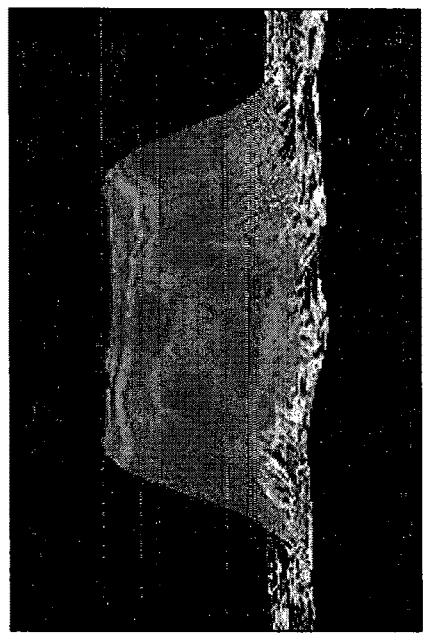
FIG. 6 shows the topology of a printed sintering paste of the present invention. The paste has a height of from 80 to 90 μm. There are no flat deposits, no dog-ears and no undulations.
Figure 6:
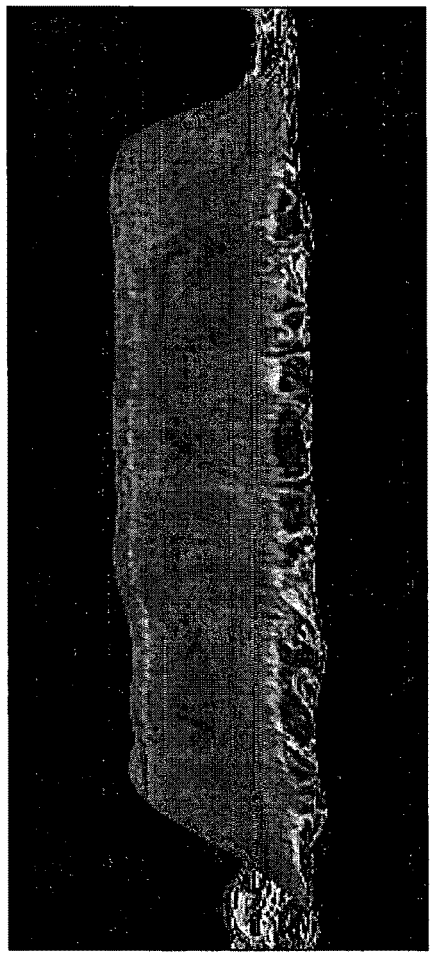
Figure 6:
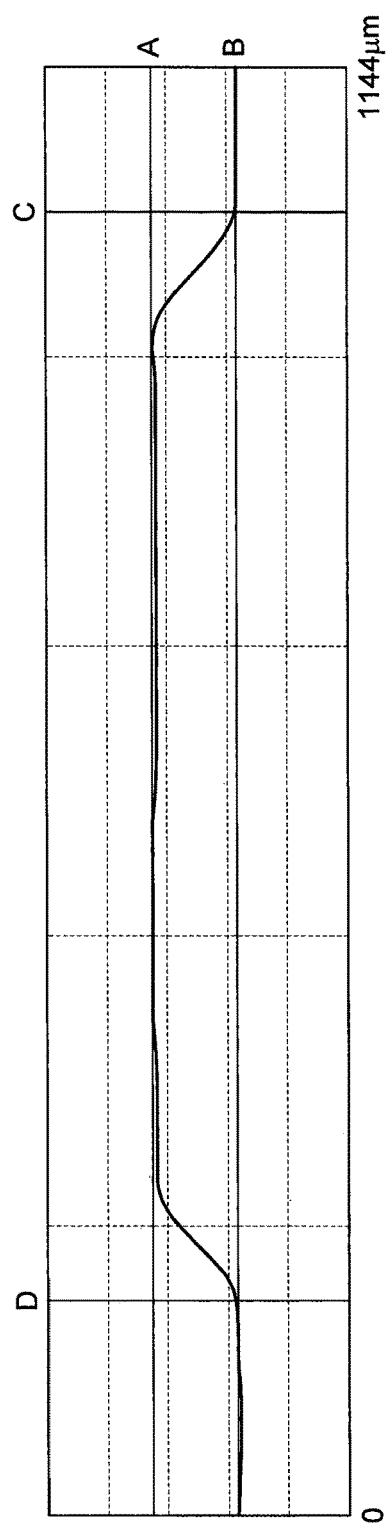
Figure 7:
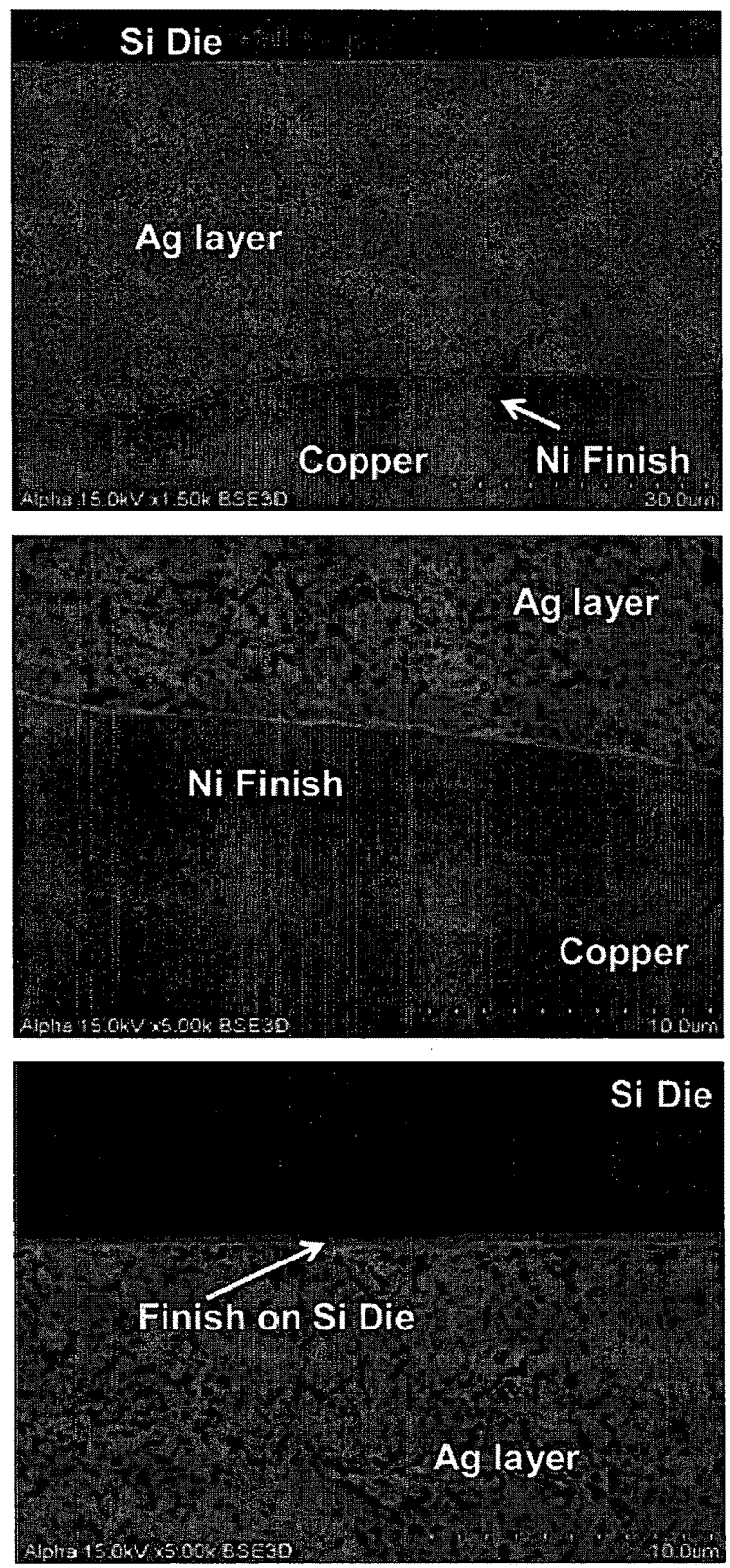
FIG. 7 shows cross-sections of a joint formed between a Si die and a substrate using a sintering paste of the present invention. The images indicate good adhesion of the sintered paste to the metallization of the die as well as the substrate.

The sintering temperature of the powder was analysed using differential scanning calorimetry (DSC) and the results are shown in FIG. 5. The plot indicates a sintering temperature of 195.2° C. with a specific heat of 36.7 J/g.

Example 2—Preparation of Sintering Paste 3 g of epoxy resin was added to 40 g of the powder of Example 1. It was then mixed in an orbital mixer at 1000 rpm. To the mixture, 3 g of solvent mixture (1.5 g of terpineol and 1.5 g of triethylene glycol) was added and mixed in an orbital mixer at 1000 rpm. After mixing it was milled in a three roll mill for a few minutes to provide a homogeneous paste. The composition of the paste is shown in Table 1.

TABLE 1

| Composition of the paste | |
| --- | --- |
| Component | Weight % |
| Silver | 86.96 |
| Resin | 6.52 |
| Solvent mixture | 6.52 |

The tackiness, viscosity and thermal conductivity of the paste were measured and the results are shown in Table 2.

The tackiness was measured in a Rhesca tackiness tester tac (II) using Japanese Industrial Standard (JIS). The paste was printed on a microscopic glass side using a 10 mil stencil of three circular openings. The immersion speed of the probe was 120 mm/min and a test speed of 600 mm/min was used with a press time of 0.2 seconds. The viscosity of the paste was measured using a Brookfield DVIII ultra programmable rheometer (Spindle CP51). The thermal conductivity was measured using a Netzsch LFA 447 Nanoflash. Thermal conductivity K was calculated using the following formula:

K=αρcp where α is the thermal diffusivity (m²/s), ρ is the density of the material (kg/m³) and cp is the specific heat capacity (J/kg-K). The tackiness, viscosity and thermal conductivity values for Examples 3, 4, 12 and 26 were measured in a similar manner.

TABLE 2

| Properties of the paste | |
| --- | --- |
| Tackiness (JIS) | 105-125 gf |
| Viscosity (2 rpm) | 170 (±15) (Pa-s) |
| Thermal conductivity | 80 W/m K |

Example 3

4 g of epoxy resin was added to 40 g of the powder of Example 1. It was then mixed in an orbital mixer at 1000 rpm. 4 g of terpineol was then added and mixing in the orbital mixer at 1000 rpm was continued. After mixing the mixture was milled in a three roll mill for a few minutes to obtain a homogenous paste.

TABLE 3

| Composition of the paste | |
| --- | --- |
| Component | Weight % |
| Silver | 83.34 |
| Resin | 8.33 |
| Terpineol | 8.33 |

TABLE 4

| Properties of the paste | |
| --- | --- |
| Tackiness (JIS) | 120-140 gf |
| Viscosity (5 rpm) | 40 (±10) (Pa-s) |

Example 4

8 g of epoxy resin and 6.67 g of terpineol were mixed thoroughly so as to obtain a homogeneous solution, which was then added to 40 g of powder of Example 1. It was then mixed in an orbital mixer at 1000 rpm. To the mixture, 4 g of terpineol was added and mixed in an orbital mixer at 1000 rpm. After mixing, the mixture was milled in a three roll mill for few minutes to obtain a homogenous paste.

TABLE 5

| Composition of the paste | |
| --- | --- |
| Component | Weight % |
| Silver | 73.17 |
| Resin | 14.63 |
| Terpineol | 12.20 |

TABLE 6

| Properties of the paste | |
| --- | --- |
| Tackiness (JIS) | 170-220 gf |
| Viscosity (5 rpm) | 30 (±10) (Pa-s) |

Example 5

2.5 g of epoxy resin, 3.4 g of solvent mixture (1.7 g of terpineol and 1.7 g of triethylene glycol) and 0.1 g of cryvallac super were mixed thoroughly to obtain a homogeneous solution, which was then added to 40 g of powder of Example 1. It was then mixed in an orbital mixer at 1000 rpm. After mixing, the mixture was milled in a three roll mill for a few minutes to obtain a homogenous paste.

TABLE 7

| Composition of the paste | |
|---|---|
| Component | Weight % |
| Silver | 86.96 |
| Resin | 5.43 |
| Solvent mixture | 7.4 |
| Rheology modifier | 0.21 |

Example 6

2.7 g of epoxy resin, 3 g of solvent mixture (1.5 g of terpineol and 1.5 g of triethylene glycol) and 0.3 g of succinic acid were mixed thoroughly to obtain a homogeneous solution, which was then added to 40 g of powder of Example 1. It was then mixed in an orbital mixer at 1000 rpm. After mixing, the mixture was milled in a three roll mill for a few minutes to obtain a homogenous paste.

TABLE 8

| Composition of the paste | |
|---|---|
| Component | Weight % |
| Silver | 86.96 |
| Resin | 5.86 |
| Solvent mixture | 6.52 |
| Activator | 0.66 |

Example 7

2.6 g of epoxy resin, 3 g of solvent mixture (1.5 g of terpineol and 1.5 g of triethylene glycol), 0.3 g of succinic acid and 0.1 g of cryvallac super were mixed thoroughly and added to 40 g of powder of Example 1. Mixing was then carried out in an orbital mixer at 1000 rpm. After mixing, the mixture was milled in a three roll mill for a few minutes to obtain a homogenous paste.

TABLE 9

| Composition of the paste | |
|---|---|
| Component | Weight % |
| Silver | 86.96 |
| Resin | 5.65 |
| Solvent mixture | 6.52 |
| Rheology modifier | 0.21 |
| Activator | 0.66 |

Example 8

40 g of the powder of Example 1, 2.88 g of epoxy resin and 0.25 g of Disperbyk163 were mixed in orbital mixer at 1000 rpm. 2.88 g of solvent mixture (propylene glycol, methyl digol and terpineol) was then added. After mixing, the mixture was milled in a three roll mill for few minutes to obtain a homogenous paste.

TABLE 10

| Composition of paste | |
|---|---|
| Composition | Weight % |
| Silver | 86.94 |
| Resin | 6.26 |
| Disperbyk163 | 0.54 |
| Propylene glycol | 1.565 |
| Methyl digol | 1.565 |
| Terpineol | 3.13 |

Example 9

40 g of the powder of Example 1, 2.88 g of epoxy resin and 0.25 g of TritonX 100 were mixed in orbital mixer at 1000 rpm. 2.88 g of solvent mixture (propylene glycol, methyl digol and terpineol) was then added. After mixing, the mixture was milled in a three roll mill for few minutes to obtain a homogenous paste.

TABLE 11

| Composition of paste | |
|---|---|
| Composition | Weight % |
| Silver | 86.94 |
| Resin | 6.26 |
| TritonX100 | 0.54 |
| Propylene glycol | 1.565 |
| Methyl digol | 1.565 |
| Terpineol | 3.13 |

Example 10

40 g of the powder of Example 1, 2.88 g of epoxy resin and 0.25 g of Disperbyk163 were mixed in orbital mixer at 1000 rpm. 2.88 g of solvent mixture was then added. After mixing, the mixture was milled in a three roll mill for few minutes to obtain a homogenous paste.

TABLE 12

| Composition of paste | |
|---|---|
| Composition | Weight % |
| Silver | 86.94 |
| Resin | 6.26 |
| Disperbyk 163 | 0.54 |
| Glycolic ester | 3.13 |
| Terpineol | 3.13 |

Example 11

40 g of the powder of Example 1, 2.93 g of epoxy resin, 0.25 g of Disperbyk163 and 0.125 g of hydoxypropylmethylcellulose were mixed in orbital mixer at 1000 rpm. 3.7 g of solvent mixture (terpineol and triacetin) was then added. After mixing, the mixture was milled in a three roll mill for few minutes to obtain a homogenous paste.

TABLE 13

| Composition of paste | |
|---|---|
| Composition | Weight % |
| Silver | 85.1 |
| Resin | 6.22 |
| Disperbyk 163 | 0.53 |
| Hydoxypropylmethylcellulose | 0.27 |
| Triacetin(Plastiziser) | 3.94 |
| Terpineol | 3.94 |

Example 12

40 g of the powder of Example 1, 2.35 g of epoxy resin, 0.46 g of Disperbyk163 and 0.46 g of polyvinyl acetate were mixed in orbital mixer at 1000 rpm. 3.72 g of solvent mixture (propylene glycol, methyl digol and terpineol) was then added. After mixing, the mixture was milled in a three roll mill for few minutes to obtain a homogenous paste.

TABLE 14

| Composition of paste | |
|---|---|
| Composition | Weight % |
| Silver | 85.1 |
| Resin | 5.0 |
| Disperbyk 163 | 1.0 |
| Polyvinyl acetate | 1.0 |
| Propylene glycol | 1.97 |
| Methyl digol | 1.97 |
| Terpineol | 3.96 |

The properties of the paste are set out in Table 14.

TABLE 15

| Properties of paste (volume resistivity measured using four probe method) | |
|---|---|
| Specific Heat | 0.413 J/g/K |
| Thermal diffusivity | 48.1 mm$^2$/s |
| Thermal conductivity | 88.7 W/m/K |
| Volume resistivity | $2.8 \times 10^{-5}$ Ω cm |

The tackiness and viscosity of the paste were measured at regular intervals to observe the stability of the paste, and the results are set out in Table 15. The results indicate that the paste is stable for 25 days at room temperature and pressure.

TABLE 16

| Viscosity/tackiness over time | | |
|---|---|---|
| Days | Viscosity (PAS) at 2 rpm | Tackiness (g/f) |
| 1 | 164 | 140 |
| 10 | 168 | 149 |
| 25 | 170 | 151 |

Example 13

6 g of epoxy resin was added to 30 g of the powder of Example 1. 5 g of terpineol was then added. The mixture was then mixed in an orbital mixer at 1000 rpm. After mixing, the mixture was milled in a three roll mill for a few minutes to obtain a homogenous paste.

TABLE 17

| Composition of paste | |
|---|---|
| Composition | Weight % |
| Silver powder | 73.17 |
| Resin | 14.63 |
| Terpineol | 12.20 |

Example 14

4.9 g of epoxy resin was added to 30 g of the powder of Example 1. 2 g of terpineol and 2 g of triethylene glycol was then added and mixed in an orbital mixer at 1000 rpm. After mixing, the mixture was milled in a three roll mill for a few minutes to obtain a homogenous paste.

TABLE 18

| Composition of paste | |
|---|---|
| Composition | Weight % |
| Silver powder | 77.12 |
| Resin | 12.60 |
| Terpineol | 5.14 |
| Triethylene glycol | 5.14 |

Example 15

6 g of epoxy resin was added to 30 g of the powder of Example 1. 3 g of terpineol and 3 g of triethylene glycol was then added and mixed in an orbital mixer at 1000 rpm. After mixing, the mixture was milled in a three roll mill for a few minutes to obtain a homogenous paste.

TABLE 19

| Composition of paste | |
|---|---|
| Composition | Weight % |
| Silver powder | 71.44% |
| Resin | 14.28% |
| Terpineol | 7.14% |
| Triethylene glycol | 7.14% |

Example 16—Printing Paste

The paste of Example 8 was printed on direct bond copper (DBC) having Au/Ni finish with a 3 mil stencil having an aperture size of 7 mm*7 mm. The printed surface was observed to be absolutely flat having no undulation. The thickness of the printed layer was around 75 μm.

The printed layer was sintered in a box oven by heating the film at 160° C. for 90 minutes. SEM indicated the necking of the silver nanoparticle with a good packing fraction.

Example 17—Preparation of Film

Figure 8:
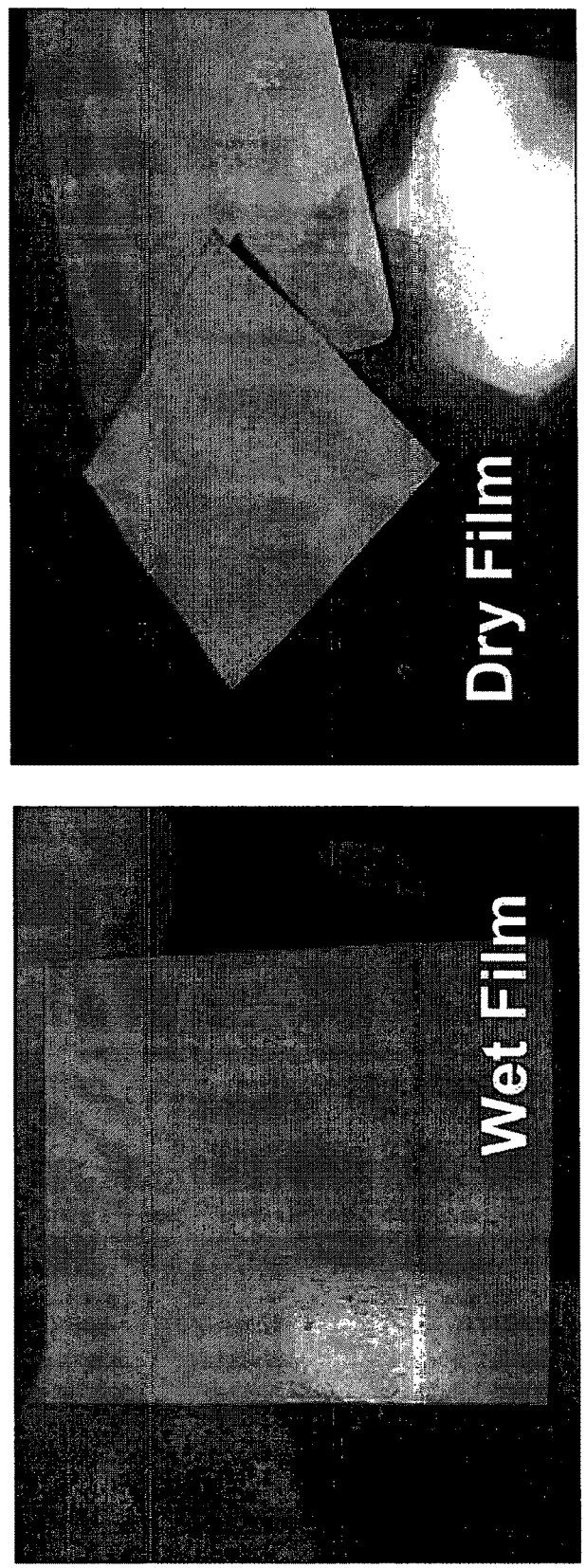
FIG. 8 shows a wet and a free standing dry film of the present invention together with the morphology of the film.
Figure 8:
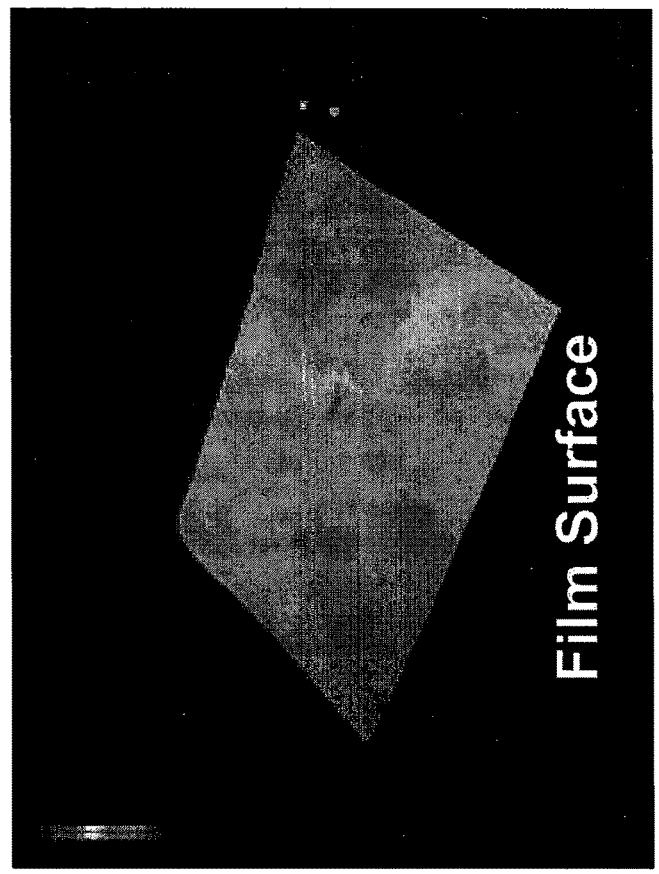
Figure 8:
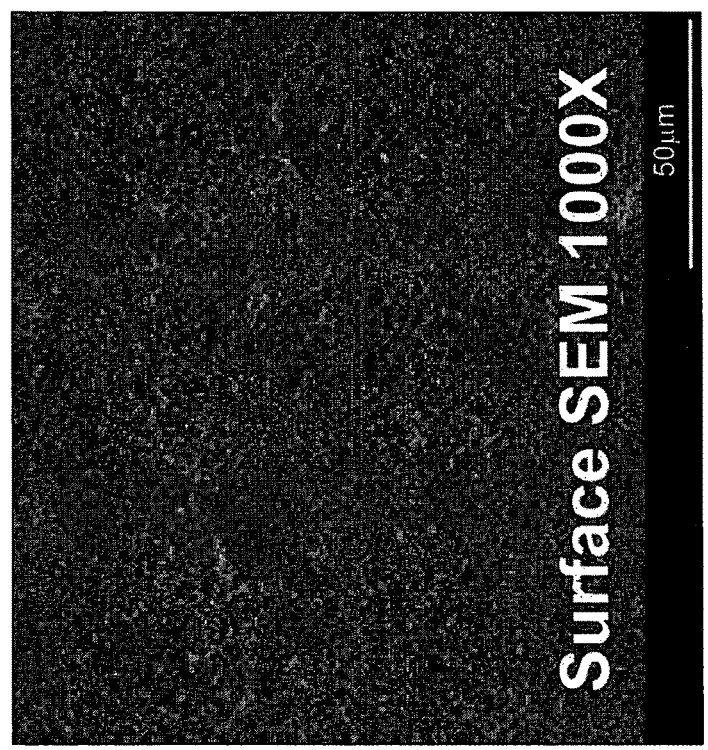

The paste of Example 2 was printed on a silicon coated polyester sheet. It was then heated at 130° C. for 30 minutes in a hot plate/box oven. The resulting film was de-attached from the sheet and could be used as a free standing film. FIG. 8 shows the film as printed in wet condition and also as a free standing dry film after being de-attached from the polyester sheet. No cracks were found in the film after it was de-attached from the polyester sheet. The thickness of the dried film was 72 μm.

The silver film was then placed on silicon rubber. The die of 3 mm*3 mm was stamped onto the film by putting a pressure of 2 MPa for a second at 130° C. with help of die bonder.

Example 18—Dispensing Paste

Figure 9:
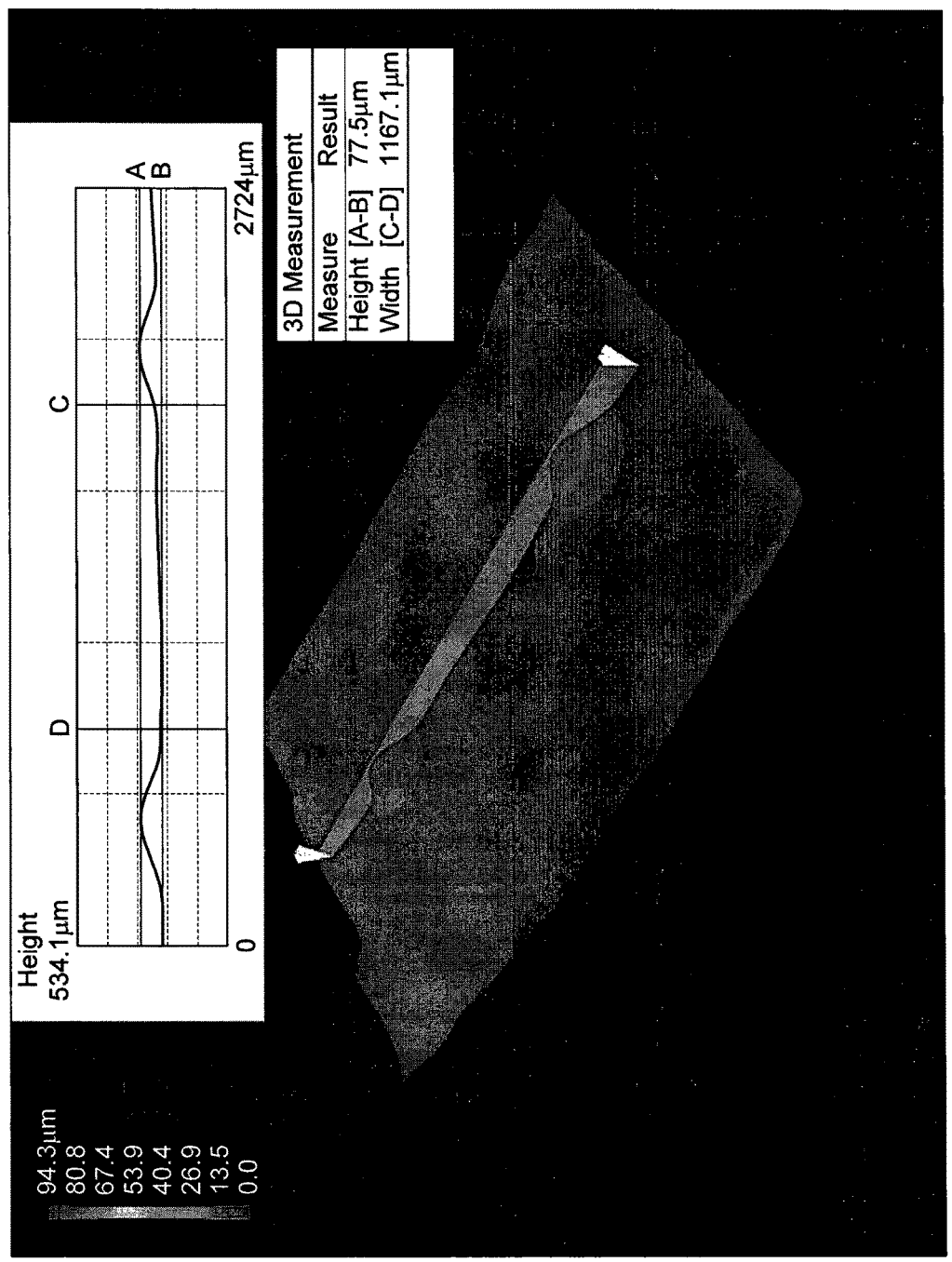
FIG. 9 shows Keyance microscope images of the topology of dispensed paste according to the present invention: dots (left hand side), pattern (right hand side).
Figure 9:
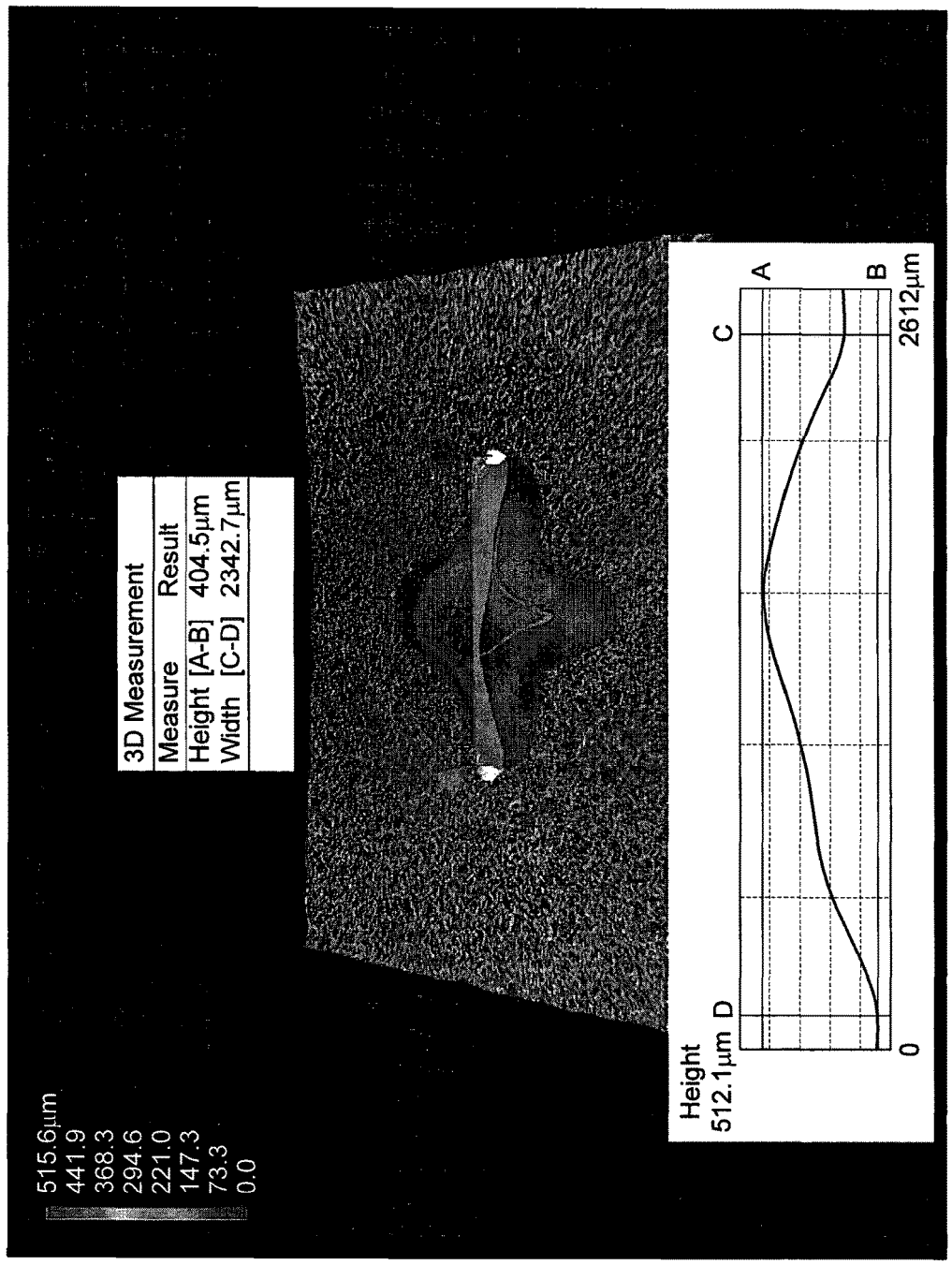
Figure 10:
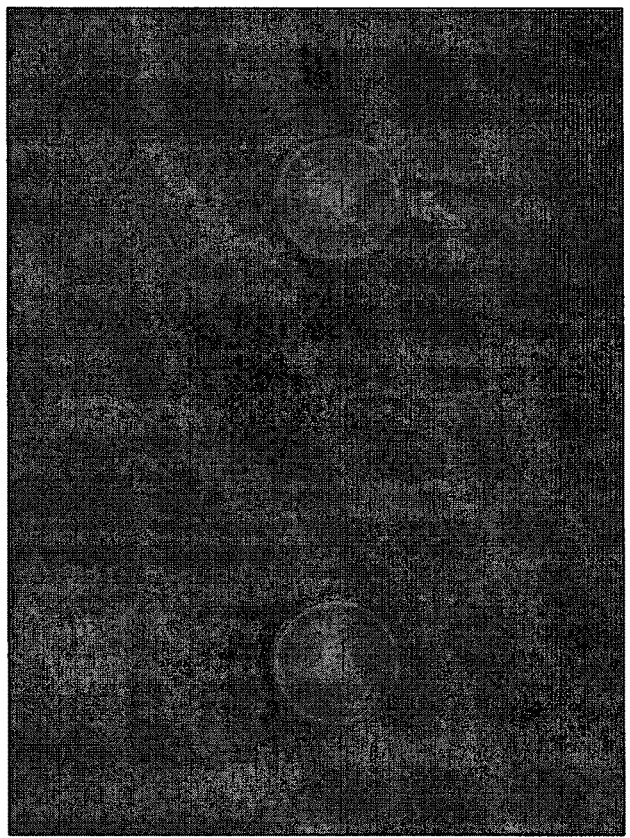
FIG. 10 shows Koh Young images of dispensed paste according to the present invention: typical image of dispensed dots (left hand side), volume measurement (right hand side).
Figure 10:
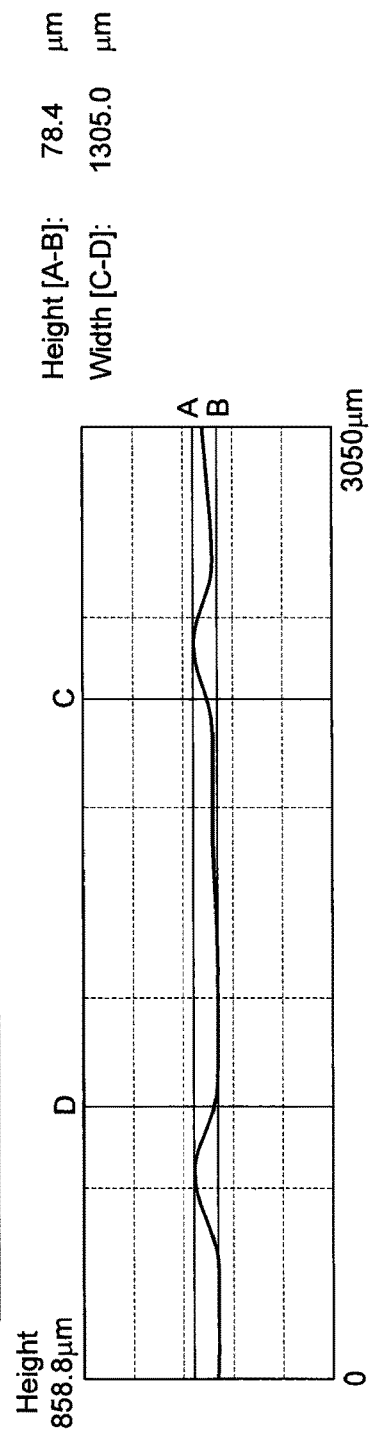
Figure 10:
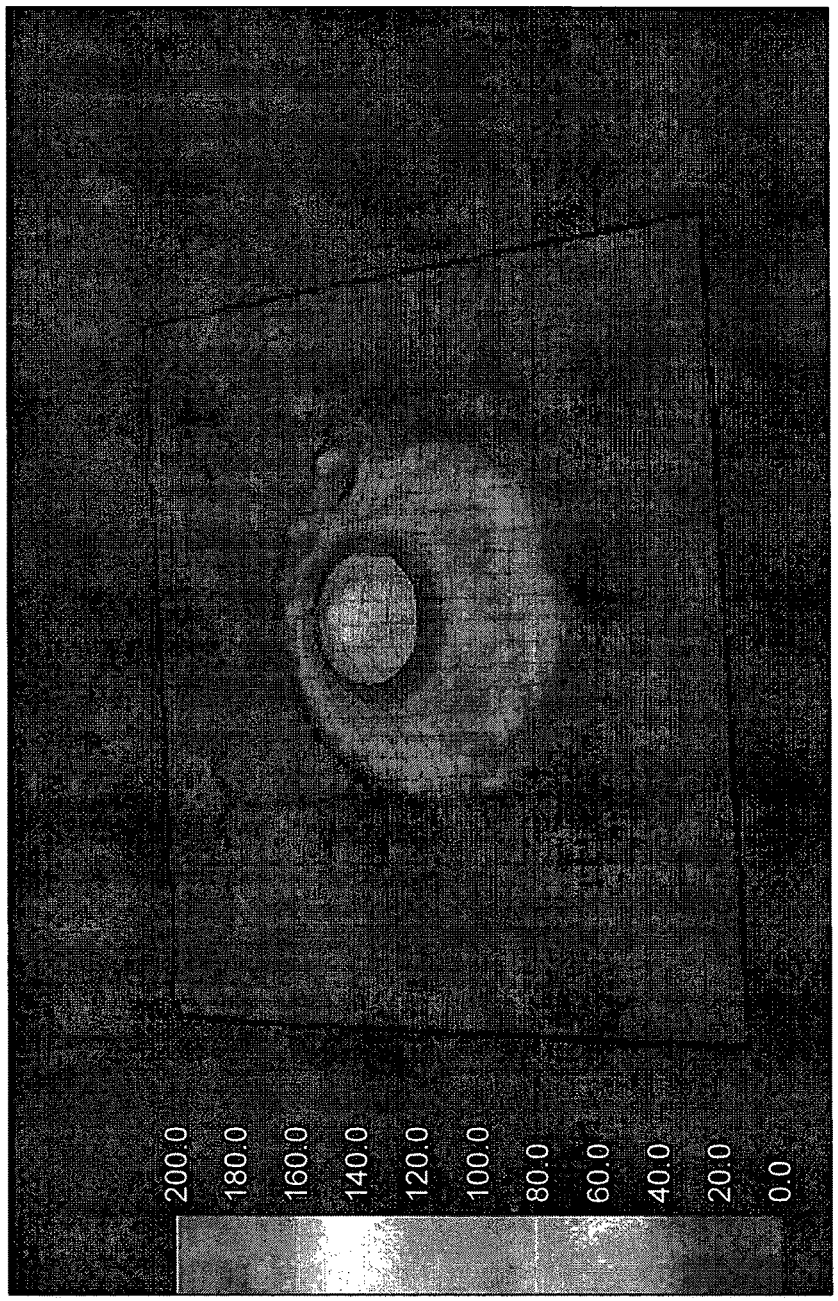

The paste of Example 15 was dispensed using a Nordson Auger Valve. The following were the set parameters for dispensing:
Needle size: 22 Gauge
Pressure: 1 Bar
Dispense Type: Point and pattern
Dispense Time: 0.15 sec The topology of the dispensed pattern was examined using a Keyance microscope (see FIG. 9). It was seen that the all the dispensed dots and patterns were of the same diameter (~520 microns) and length (2.3 mm), respectively. The volume of the dispensed patterns were then examined using a Koh Young apparatus (see FIG. 10), which revealed consistent dispense deposit and height (~63.6 microns to 67.2 microns).

Example 19

5.55 g of terpineol was mixed with 1.48 g of Silver Oxalate. To this mixture 30 g of the powder of Example 1 was added and mixed in an orbital mixer at 1000 rpm. After mixing, the mixture was milled in a three roll mill for a few minutes to obtain a homogenous paste.

TABLE 20

| Composition of paste | |
|---|---|
| Composition | Weight % |
| Silver powder | 81% |
| Silver oxalate | 4% |
| Terpineol | 15% |

Example 20

1.39 g of terpineol, 2.08 g of propylene glycol, 2.08 g of methyl digol was mixed with 1.48 g of Silver Oxalate. To this mixture 30 g of the powder of Example 1 was added and mixed in an orbital mixer at 1000 rpm. After mixing, the mixture was milled in a three roll mill for a few minutes to obtain a homogenous paste.

TABLE 21

| Composition of paste | |
|---|---|
| Composition | Weight % |
| Silver powder | 81% |
| Silver oxalate | 4% |
| Propylene glycol | 5.61% |

TABLE 21-continued

| Composition of paste | |
|---|---|
| Composition | Weight % |
| Methyl digol | 5.61% |
| Terpineol | 3.78% |

Example 21

0.925 g of terpineol, 1.39 g of propylene glycol, 1.39 g of methyl digol was mixed with 3.33 g of Silver Oxalate. To this mixture 30 g of the powder of Example 1 was added and mixed in an orbital mixer at 1000 rpm. After mixing, the mixture was milled in a three roll mill for a few minutes to obtain a homogenous paste.

TABLE 22

| Composition of paste | |
|---|---|
| Composition | Weight % |
| Silver powder | 81% |
| Silver oxalate | 9% |
| Propylene glycol | 3.75% |
| Methyl digol | 3.75% |
| Terpineol | 2.5% |

Example 22

0.9 g of terpineol, 1.35 g of propylene glycol, 1.35 g of methyl digol was mixed with 7.2 g of Silver Oxalate. To this mixture 25.2 g of the powder of Example 1 was added and mixed in an orbital mixer at 1000 rpm. After mixing, the mixture was milled in a three roll mill for a few minutes to obtain a homogenous paste.

TABLE 23

| Composition of paste | |
|---|---|
| Composition | Weight % |
| Silver powder | 70% |
| Silver oxalate | 20% |
| Propylene glycol | 3.75% |
| Methyl digol | 3.75% |
| Terpineol | 2.5% |

Example 23

0.074 g of Lauric acid was mixed with 2.59 g of Silver Oxalate. To this 1.85 g of terpineol, 2.22 g of propylene carbonate, 0.296 g of Hydrogen peroxide was added and mixed. To this mixture 30 g of the powder of Example 1 was added and mixed in an orbital mixer at 1000 rpm. After mixing, the mixture was milled in a three roll mill for a few minutes to obtain a homogenous paste.

TABLE 24

| Composition of paste | |
|---|---|
| Composition | Weight % |
| Silver powder | 81% |
| Silver oxalate | 7% |

TABLE 24-continued

| Composition of paste | |
|---|---|
| Composition | Weight % |
| Lauric Acid | 0.2% |
| Propylene carbonate | 6.00% |
| Terpineol | 5.00% |
| Hydrogen peroxide | 0.8% |

Example 24

0.074 g of Lauric acid was mixed with 3.33 g of Silver Oxalate. To this 1.85 g of terpineol, 1.48 g of propylene carbonate, 0.296 g of hydrogen peroxide was added and mixed. To this mixture 30 g of the powder of Example 1 was added and mixed in an orbital mixer at 1000 rpm. After mixing, the mixture was milled in a three roll mill for a few minutes to obtain a homogenous paste.

TABLE 25

| Composition of paste | |
|---|---|
| Composition | Weight % |
| Silver powder | 81% |
| Silver oxalate | 9% |
| Lauric Acid | 0.2% |
| Propylene carbonate | 4.00% |
| Terpineol | 5.00% |
| Hydrogen peroxide | 0.8% |

Example 25

0.074 g of Lauric acid was mixed with 2.96 g of Silver Oxalate. To this 2.03 g of terpineol, 1.67 g of propylene carbonate, 0.296 g of hydrogen peroxide was added and mixed. To this mixture 30 g of the powder of Example 1 was added and mixed in an orbital mixer at 1000 rpm. After mixing, the mixture was milled in a three roll mill for a few minutes to obtain a homogenous paste.

TABLE 26

| Composition of paste | |
|---|---|
| Composition | Weight % |
| Silver powder | 81% |
| Silver oxalate | 8% |
| Lauric Acid | 0.2% |
| Propylene carbonate | 4.5% |
| Terpineol | 5.48% |
| Hydrogen peroxide | 0.8% |

Example 26

0.074 g of Lauric acid was mixed with 2.96 g of Silver Oxalate. To this 2.58 g of terpineol, 1.11 g of propylene carbonate, 0.296 g of hydrogen peroxide was added and mixed. To this mixture 30 g of the powder of Example 1 was added and mixed in an orbital mixer at 1000 rpm. After mixing, the mixture was milled in a three roll mill for a few minutes to obtain a homogenous paste.

TABLE 27

| Composition of paste | |
|---|---|
| Composition | Weight % |
| Silver powder | 81% |
| Silver oxalate | 8% |
| Lauric Acid | 0.2% |
| Propylene carbonate | 3.0% |
| Terpineol | 6.98% |
| Hydrogen peroxide | 0.8% |

The properties of the paste are set out in the table below.

TABLE 28

| Properties of paste | |
|---|---|
| Specific Heat | 0.27 J/g · K |
| Thermal diffusivity | 99.5 mm$^2$/s |
| Thermal conductivity | 223.6 W/m · K |
| Density | 8.65 g/cm$^3$ |
| Viscosity at 2 rpm (Pas) | 50 (±10%) |
| Tack (gf) | 95 (±10%) |

The paste of this example exhibits good printing features. The cross section of a die attached material using the paste exhibited an excellent packing fraction, and the joint strength was around 20 MPa.

Example 27

0.212 g of Lauric acid was mixed with 3.59 g of Silver Oxalate. To this 5.89 g of terpineol, 4.85 g of propylene carbonate, 0.859 g of hydrogen peroxide was added and mixed. To this mixture 30 g of the powder of Example 1 was added and mixed in an orbital mixer at 1000 rpm. After mixing, the mixture was milled in a three roll mill for a few minutes to obtain a homogenous paste.

TABLE 29

| Composition of paste | |
|---|---|
| Composition | Weight % |
| Silver powder | 69.99% |
| Silver oxalate | 6.99% |
| Lauric Acid | 0.413% |
| Propylene carbonate | 9.45% |
| Terpineol | 11.48% |
| Hydrogen peroxide | 1.674% |

Example 28

0.174 g of Lauric acid was mixed with 4.61 g of Silver Oxalate. To this 4.86 g of terpineol, 4 g of propylene carbonate, 0.708 g of hydrogen peroxide was added and mixed. To this mixture 30 g of the powder of Example 1 was added and mixed in an orbital mixer at 1000 rpm. After mixing, the mixture was milled in a three roll mill for a few minutes to obtain a homogenous paste.

TABLE 30

| Composition of paste | |
| --- | --- |
| Composition | Weight % |
| Silver powder | 72.01% |
| Silver oxalate | 9.00% |
| Lauric Acid | 0.34% |
| Propylene carbonate | 7.8% |
| Terpineol | 9.47% |
| Hydrogen peroxide | 1.38% |

Example 29

0.074 g of Lauric acid was mixed with 2.96 g of Silver Lactate. To this 2.58 g of terpineol, 1.11 g of propylene carbonate, 0.296 of Hydrogen peroxide was added and mixed. To this mixture 30 g of the powder of Example 1 was added and mixed in an orbital mixer at 1000 rpm. After mixing, the mixture was milled in a three roll mill for a few minutes to obtain a homogenous paste.

TABLE 31

| Composition of paste | |
| --- | --- |
| Composition | Weight % |
| Silver powder | 81% |
| Silver Lactate | 8% |
| Lauric Acid | 0.2% |
| Propylene carbonate | 3.0% |
| Terpineol | 6.98% |
| Hydrogen peroxide | 0.8% |

Example 30

0.074 g of Lauric acid was mixed with 7.4 g of Silver Lactate. To this 2.59 g of terpineol, 1.11 g of propylene carbonate, 0.296 of Hydrogen peroxide was added and mixed. To this mixture 25.55 g of the powder of Example 1 was added and mixed in an orbital mixer at 1000 rpm. After mixing, the mixture was milled in a three roll mill for a few minutes to obtain a homogenous paste.

TABLE 32

| Composition of paste | |
| --- | --- |
| Composition | Weight % |
| Silver powder | 69% |
| Silver Lactate | 20% |
| Lauric Acid | 0.2% |
| Propylene carbonate | 3.0% |
| Terpineol | 7.0% |
| Hydrogen peroxide | 0.8% |

Example 31

85-90% of the powder of Example 1 and 0 to 1% of fatty acid was mixed in a jar A. In another jar B, 0 to 3% of propylene carbonate, 3 to 8% of terpineol, 3 to 8% triethylene glycol and 0 to 2% organic peroxide were mixed. The mixture from jar A was added to jar B and mixed in an orbital mixer at 1000 rpm. After mixing, the mixture was milled in a three roll mill for a few minutes to obtain a homogenous paste.

Example 32

80-85% of the powder of Example 1, 0 to 5% of silver compound and 0 to 1% of fatty acid was mixed in a jar A. In another jar B, 0 to 3% of propylene carbonate, 3 to 8% of terpineol, 7 to 10% triethylene glycol and 0 to 2% organic peroxide were mixed. The mixture from jar A was added to jar B and mixed in an orbital mixer at 1000 rpm. After mixing, the mixture was milled in a three roll mill for a few minutes to obtain a homogenous paste.

Example 33

85-90% of the power of Example 1, 0 to 5% of silver compound and 0 to 1% of fatty acid was mixed in a jar A. In another jar B, 0 to 3% of propylene carbonate, 3 to 8% of terpineol, 3 to 8% triethylene glycol and 0 to 2% organic peroxide were mixed. The mixture from jar A was added to jar B and mixed in an orbital mixer at 1000 rpm. After mixing, the mixture was milled in a three roll mill for a few minutes to obtain a homogenous paste.

Example 34

75-80% of the powder of Example 1, 0 to 5% of silver compound and 0 to 1% of fatty acid was mixed in a jar A. In another jar B, 0 to 3% of propylene carbonate, 3 to 8% of terpineol, 6 to 12% triethylene glycol and 0 to 5% organic peroxide were mixed in jar B. The mixture from jar A was added to jar B and mixed in an orbital mixer at 1000 rpm. After mixing, the mixture was milled in a three roll mill for a few minutes to obtain a homogenous paste.

Example 34

80-85% of the powder of Example 1, 5 to 10% of Silver compound and 0 to 1% of fatty acid was mixed in a jar A. In another jar B, 0 to 5% of propylene carbonate, 0 to 5% of terpineol, 3 to 7% triethylene glycol and 0 to 2% organic peroxide were mixed. The mixture from jar A was added to jar B and mixed in an orbital mixer at 1000 rpm. After mixing, the mixture was milled in a three roll mill for a few minutes to obtain a homogenous paste.

Example 35

0.3M $AgNO_3$ solution was made in aqueous medium. To the aqueous solution of $AgNO_3$, reducing agent was added drop wise. The solution was stirred for 1 hour at room temperature. Silver starts precipitating out on the addition of the reducing agent and the supernatant becomes fully colorless. The solution mixture was then filtered using a Buchner funnel. The micron silver powder obtained was then washed with water so as to remove excess silver salt and reducing agent. Final washing was then done with acetone so as to ensure the complete removal of water.

The powder obtained was then characterized with SEM, indicating a particle size of around 600 nm to 1 micron.

Example 36

80-85% of mixture the powders of Example 1 and Example 35 (about 90 wt % Example 1, about 10 wt % Example 35), 5 to 10% of silver lactate and 0 to 1% of lauric acid were mixed in a jar A. In another jar B, 0 to 5% of propylene carbonate, 0 to 5% of terpineol, 3 to 7% triethylene glycol and 0 to 2% organic peroxide were mixed. The mixture from jar A was added to jar B and mixed in an orbital mixer at 1000 rpm. After mixing, the mixture was milled in a three roll mill for a few minutes to obtain a homogenous paste.

Example 37

85-90% of the powder of Example 35, 0 to 5% of silver lactate and 0 to 1% of lauric acid were mixed in a jar A. In another jar 0 to 3% of propylene carbonate, 3 to 8% of terpineol, 3 to 8% triethylene glycol and 0 to 2% organic peroxide were mixed in jar B. The mixture from Jar A was added to B and mixed in an orbital mixer at 1000 rpm. After mixing, the mixture was milled in a three roll mill for a few minutes to obtain a homogenous paste.

Example 38

80-85% of the powder of Example 35, 5 to 10% of silver lactate and 0 to 1% of lauric acid was mixed in a jar A. In another jar 0 to 5% of propylene carbonate, 0 to 5% of terpineol, 3 to 7% triethylene glycol and 0 to 2% organic peroxide were mixed in jar B. The mixture from Jar A was added to B and mixed in an orbital mixer at 1000 rpm. After mixing, the mixture was milled in a three roll mill for a few minutes to obtain a homogenous paste.

Example 39—Printing Paste

Print Definition:
The paste of Example 31 was printed on direct bond copper (DBC) having Au/Ni finish with a 3 mil stencil having an aperture size of 3 mm*3 mm. It was observed that the printed surface was absolutely flat having no undulation. The thickness of the printed layer was around 75 um.
Die Placement:
Gold metalized silicon dies were placed on the printed pattern using a die bonder. The uniform print deposit was confirmed by Koh Young 8030 as shown in graph below. The vehicle was then kept in a box oven for sintering at different temperature profile.
Temperature Profile:
Silicon die metallized with gold coating was placed with the help of a die bonder using controlled Z height and was sintered at 180° C., 200° C., 225° C. and 250° C. in a box oven. It is seen that the joint strength decreased when heated after 225° C.
In this Example, 200° C. was considered the optimized sintering temperature, since high temperature die shear at 260° C. shows a drop of around 50%.
Cross Section of the Sintered Layer:
The cross section of the above die attached material shows a good diffusion of silver nanoparticle at both the interfaces (die side as well as on the substrate side). SEM reveals a very good packing fraction with very good necking phenomena.
Dispense Topology:
The paste of the above example was also dispensed using Nordson EFD dispenser. The nanosilver paste was dispensed at 0.8 bar pressure and a speed of 40 mm/sec on lead frames.
Die Placement:
Gold metalized silicon dies were placed on the dispensed pattern using a die bonder. Uniform dispensing was observed throughout. The vehicle was kept in a box oven. The average die shear obtained was around 20-25 MPa with 100% pad coverage. About 20% deterioration was seen when the shearing was done at 260° C.

Cross Section of the Sintered Layer:
The cross section of the above die attached material shows a good diffusion of silver nanoparticle at both the interfaces (die side as well as on the substrate side). SEM reveals the bond line thickness of around 20 micron.

As will be appreciated, the method, powder, paste and film disclosed herein are associated with a number of benefits over prior art techniques. In particular, there is no slump phenomena, no bridges, no bubbles in print deposit, no bleed-out and no aperture blocking when printing with the paste. Moreover, it is possible to provide a paste height of from 80-90 micrometers with flat deposits, no Dog-ears and no undulations. Thus, the benefits of the paste which includes a binder (e.g. resin) include:
  Pressure-less Sintering
  Process ability in standard SMT Line
  Flat and uniform surface topology
  Die Shear Strength average >20 MPa
  No interfacial failure mode
  Room Temp Stability=min 1 month
  Thermal Cycling: Acceptable joint strength up to 1500 cycles (−40 C to +125 C, 10 min dwell).
  Needle and Jet Dispensable
  Film Form Factor In addition to the benefits mentioned above, the paste containing organosilver compound has some further benefits which are listed below:
  High die shear strength (25 to 45 MPa)
  High thermal conductivity (>200 W/mK)
  Pin transferable
  Good high thermal properties The sintering powder, paste and film will now be further described, by way of example, with reference to the following non-limiting applications A-H:

A. Attachment of semiconductor die (either flip chip or wire bonded), onto a variety of substrates such as DBC (Direct Bond Copper), DPC (Direct Plate Copper), MCPCB (Metal Core PCBs), FR4, Copper lead-frames, Flexible PCBs and substrates, Copper and Aluminum Heat-Sinks, Fixtures, etc.). Applications include LED die (light emitting diodes for example of the lateral, vertical thin film or flip chip varieties) made from various compound semiconductor materials, power die made from silicon, concentrated photovoltaic compound semiconductor cells (e.g. multi-junction cells) silicon carbide and gallium nitride used in power modules, and discretes, MEMS (micro-electromechanical sensor) devices of all types, semiconductor and stacked die, Thermoelectric material element attach to substrates, as well as Piezo-electric element stack attach, and oscillator crystals and optical and other sensor device attach. The attachment of such semiconductor or other die elements may be accomplished by printing on to the substrates, followed by die placement via a die bonder or a pick and place machine, and sintering in either a reflow oven belt oven or box oven. Attachment of such semiconductor and die elements can also be accomplished via dispensing the paste, followed by die placement and sintering as outlined above, or doing film transfer and lamination on the die backside of the film made from the said material, followed by die placement and tacking onto the substrate, followed by sintering. Flip chip die can be assembled by printing bumps on the substrate, placing the die, followed by sintering. Low temperature sintering, and sintering with a regular short lead free reflow profile enables assembly of high CTE mismatch stacks as well as temperature sensitive material stacks. A major benefit of the sintering powder as disclosed herein in such applications is improved throughput with short cycle times while using existing standard installed equipment (such as printers, die bonders and reflow/belt ovens).

B. Attachment of semiconductor packages of various types (for example bottom termination components such as, for example, LGAs, QFNs, QFPs), onto a variety of substrates such as, for example, DBC (Direct Bond Copper), DPC (Direct Plate Copper), MCPCB (Metal Core PCBs), FR4, Flexible PCBs and substrates, Copper and Aluminum Heat-Sinks, Fixtures, etc.). Applications include LED packages of various types (for example, ceramic submount LEDs, SMD LEDs with leadframe construction, etc.) power modules, and discretes, MEMS (micro-electromechanical sensor) packages of all types, semiconductor and stacked die packages, Thermoelectric material element attach to substrates, as well as Piezo-electric element stack attach, and oscillator crystals and optical and other sensor device attach. The attachment of such semiconductor or other packages can be accomplished by printing on to the substrates, followed by package placement via standard a pick and place machine with Z Height adjustment and/or pressure capability, and sintering in either a reflow oven belt oven or box oven. Low temperature sintering and sintering with a regular short lead free reflow profile enables assembly of high CTE mismatch stacks as well as temperature sensitive material stacks. A major benefit of the sintering powder as disclosed herein in such applications is improved throughput with short cycle times while using existing standard installed equipment (such as printers, die bonders and reflow/belt ovens).

C. Production of interconnect lines ('circuitry, pads, etc.) separately and along with flip chip interconnects. For example, applications for interconnect lines include LED boards and luminaries, where the interconnect lines can be applied by a variety of printing (e.g. stencil printing) or dispensing or jetting techniques. In the case of LED applications, such interconnects can serve as both electrical and thermal conductors to carry the electrons to and from the device, and the heat away from the device. Further, such interconnect lines can be directly applied in the same step with interconnects for attaching flip chip or wire bonded devices. Another example of such interconnects is solar cells (either silicon based or thin film based), where the interconnects in a grid pattern could be used to collect electrons generated, and also connect one cell to another. Another example of such applications is an OLED device where a grid of such interconnect lines can be used to enhance the electrical conductivity of transparent conductive films.

D. Wafer-to-wafer bonding layers, based on both printable pastes and films. There is a significant need for wafer-to-wafer bonding at low temperatures (under 250° C.) where the bonding layer exhibits very high temperature properties post bonding. In the case of LED wafer bonding, this can be accomplished for example, in the context of either thin film flip chip or vertical thin film or truncated inverted pyramid LEDs, where CTE mismatch and therefore strain and defect generation can be minimized, while allowing for high temperature post processing with a variety of advanced materials for enhancing light output and electrical efficiency of the device. Further, the high temperature and high thermal and electrical conductivities of the bonding layer allow for superior thermal transfer, high temperature operation of the device and superior current spreading, among other advantages. Such wafer bonding can be accomplished by lamination of films of the said material on the backside of the wafers, followed by temperature and pressure processing in a standard wafer bonder or a press. Another means of doing the processing includes printing a conformal layer of paste on the wafer backside, followed by drying and bonding in a standard wafer bonder or press, under temperature and pressure conditions. Applications for such wafer bonding include power semiconductor wafers, Through Silicon Via (TSV) applications, stacked die applications, MEMS, Thermoelectric Material wafers, Piezo-electric materials, concentrated photovoltaics and other applications. Low temperature sintering enables assembly of high CTE mismatch stacks as well as temperature sensitive material stacks. A major benefit of the sintering powder as disclosed herein in such applications is improved throughput with short cycle times while using existing standard installed equipment (such as printers/laminators, wafer bonders and reflow/belt ovens).

E. Wafer back-side lamination, based on both printable pastes and films. In certain applications there is a need to laminate the back-side of the semiconductor wafers with the solder powder as disclosed herein in paste or film form, prior to drying and dicing. Such an approach can provide a convenient way to apply the die attach material to the wafer prior to mounting on dicing tape and dicing, so that it can be transported to the die bonder with the pre-laminated Supernova N die attach material. Applications for such an approach can include lateral and vertical LED devices, semiconductor die used in power electronics (power modules, and discretes), MEMS (micro-electromechanical sensor) packages of all types, semiconductor and stacked die packages and other applications, Thermoelectric Materials, Piezo-electric element stack attach, and other applications such as oscillator crystals and optical and other sensor device attach.

F. Reflective layer printing for LED and optical applications. The said material can be used to print reflective layers on to substrates such as DBC (Direct Bond Copper), DPC (Direct Plate Copper), MCPCB (Metal Core PCBs), FR4, Flexible PCBs and substrates, Copper and Aluminum Heat-Sinks, Fixtures, etc.), in order to provide light output enhancement and therefore luminous efficacy enhancement of LED and other optical systems. Such reflective layers can be formed via stencil or screen printing, jetting or dispensing or film lamination of the said material. A major benefit of the sintering powder as disclosed herein in such applications is improved throughput with short cycle times while using existing standard installed equipment (such as printers/laminators, wafer bonders and reflow/belt ovens).

G. Hermetic and near hermetic sealing for packages, perimeter seals, etc. for LED, MEMS, optical sensors and oscillator crystals, OLED and PV applications and general semiconductor packaging. There is a significant need for hermetic sealing of LED, OLED, MEMS and thin film PV packages, to protect the devices from moisture ingress. The said material can exhibit hermetic or near hermetic sealing behavior with proper application and sintering. The said material can be applied in various stages of the manufacturing processes for the above devices: Either at the wafer level with wafer bonding, or in the packaging process via film lamination and bonding, or paste jetting/dispensing followed by lid or glass or laminate cover attach and sintering. Low temperature sintering and sintering with a regular short lead free reflow profile enables assembly of high CTE mismatch stacks as well as temperature sensitive material stacks.

H. ACF Replacements. Arrays of bumps of the said material can be delivered to the substrate via stencil printing, bump transfer, or high speed jet dispensing. Such arrays can be used to serve as electrical contacts to assemble devices without explicit high degrees of alignment. Low temperature sintering and sintering with a regular short lead free reflow profile enables such applications. A major benefit of the sintering powder as disclosed herein in such applications is improved throughput with short cycle times while using existing standard installed equipment (such as printers/laminators, wafer bonders and reflow/belt ovens).

The foregoing detailed description has been provided by way of explanation and illustration, and is not intended to limit the scope of the appended claims. Many variations in the presently preferred embodiments illustrated herein will be apparent to one of ordinary skill in the art and remain within the scope of the appended claims and their equivalents.

The invention claimed is:

1. A sintering powder comprising:
a particulate comprising heterogeneous particles having a mean longest diameter of less than 10 microns, wherein at least some of the particles forming the particulate comprise a metal at least partially coated with a capping agent, wherein the particulate comprises a first type of particles having a longest diameter of from 1 to 100 nm and a second type of particles having a longest diameter of from greater than 100 nm to 50 microns, and wherein the particulate comprises from 81 to 99 wt % of the first type of particles and from 1 to 19 wt % of the second type of particles.

2. The sintering powder of claim 1 wherein the capping agent comprises an amine and/or a carboxylate functional group.

3. The sintering powder of claim 2 wherein the capping agent comprises a straight chain or branched chain aliphatic amine.

4. The sintering powder of claim 2 wherein the metal comprises silver or an alloy thereof.

5. The sintering powder of claim 2 comprising from 0.1 to 3 wt % capping agent.

6. The sintering powder of claim 1, wherein the first type of particles have a diameter of from 5 to 75 nm and/or the second type of particles have a diameter of from greater than 100 nm to 20 microns.

7. The sintering powder of claim 5, wherein the particulate has a mean longest diameter of from 1 to 100 nm.

8. The sintering powder of claim 5, wherein the particulate has a mean longest diameter of from 100 nm to 10 microns.

* * * * *